US011719975B2

(12) United States Patent
Yamashita et al.

(10) Patent No.: US 11,719,975 B2
(45) Date of Patent: *Aug. 8, 2023

(54) LIGHT-EMITTING MODULE AND SURFACE-EMITTING LIGHT SOURCE

(71) Applicant: NICHIA CORPORATION, Anan (JP)

(72) Inventors: Ryohei Yamashita, Tokushima (JP); Toshinobu Katsumata, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/443,953

(22) Filed: Jul. 29, 2021

(65) Prior Publication Data

US 2022/0269129 A1    Aug. 25, 2022

Related U.S. Application Data

(63) Continuation of application No. 17/005,297, filed on Aug. 27, 2020, now Pat. No. 11,106,082.

(30) Foreign Application Priority Data

Aug. 30, 2019 (JP) .............................. JP2019-157972
Apr. 21, 2020 (JP) .............................. JP2020-075731

(51) Int. Cl.
*G02F 1/13357* (2006.01)
*H01L 33/50* (2010.01)
(Continued)

(52) U.S. Cl.
CPC ..... *G02F 1/133603* (2013.01); *G02B 6/0025* (2013.01); *G02B 6/0031* (2013.01);
(Continued)

(58) Field of Classification Search
CPC ....... H01L 33/60; H01L 33/62; H01L 33/505; G02B 6/0031; G02B 6/0025;
(Continued)

(56) References Cited

U.S. PATENT DOCUMENTS

2005/0265029 A1    12/2005   Epstein et al.
2007/0121340 A1     5/2007   Hoshi
(Continued)

FOREIGN PATENT DOCUMENTS

CN    108957846 A    12/2018
JP    2007149451 A    6/2007
(Continued)

OTHER PUBLICATIONS

Notice of Allowance, United States Patent and Trademark Office, issued to U.S. Appl. No. 17/005,297 dated Apr. 28, 2021, 9 pages.

*Primary Examiner* — Evan P Dzierzynski
*Assistant Examiner* — Nathaniel J Lee
(74) *Attorney, Agent, or Firm* — Hunton Andrews Kurth LLP

(57) ABSTRACT

A light-emitting module includes a light-guiding plate having an upper surface with a first hole and having a rectangular shape in a top view, and a light-emitting element opposite to the first hole and disposed opposite to the upper surface. The first hole includes a first portion and a second portion between the first portion and the upper surface. The first portion is provided with a first opening at a boundary between the first portion and the second portion and a first lateral surface inclined with respect to the upper surface. A shape of the first opening in the top view is defined by a first axis parallel to a short side of the rectangular shape of the light-guiding plate and a second axis parallel to a long side of the rectangular shape and shorter than the first axis in a plan view.

20 Claims, 19 Drawing Sheets

(51) Int. Cl.
*F21V 8/00* (2006.01)
*H01L 33/62* (2010.01)
*H01L 33/60* (2010.01)
*G02F 1/1335* (2006.01)

(52) U.S. Cl.
CPC .. *G02F 1/133605* (2013.01); *G02F 1/133607* (2021.01); *H01L 33/505* (2013.01); *H01L 33/60* (2013.01); *H01L 33/62* (2013.01)

(58) Field of Classification Search
CPC ......... G02F 1/133603; G02F 1/133605; G02F 1/133607
See application file for complete search history.

(56) References Cited

U.S. PATENT DOCUMENTS

| | | | |
|---|---|---|---|
| 2009/0086508 A1 | 4/2009 | Bierhuizen | |
| 2010/0079980 A1 | 4/2010 | Sakai | |
| 2011/0109839 A1 | 5/2011 | Zhu et al. | |
| 2012/0032202 A1* | 2/2012 | Ogata | G02F 1/133606 257/E33.073 |
| 2015/0116984 A1 | 4/2015 | Dai et al. | |
| 2018/0239193 A1 | 8/2018 | Hayashi | |
| 2018/0335559 A1* | 11/2018 | Cho | G02B 6/0091 |
| 2019/0049649 A1 | 2/2019 | Hayashi et al. | |
| 2019/0294005 A1 | 9/2019 | Imada et al. | |
| 2020/0049877 A1 | 2/2020 | Watanabe et al. | |

FOREIGN PATENT DOCUMENTS

| | | |
|---|---|---|
| JP | 2007329114 A | 12/2007 |
| JP | 2010108919 A | 5/2010 |
| JP | 2010541154 A | 12/2010 |
| JP | 2011258581 A | 12/2011 |
| JP | 2012204337 A | 10/2012 |
| JP | 2013030404 A | 2/2013 |
| JP | 2014116104 A | 6/2014 |
| JP | 2018101521 A | 6/2018 |
| JP | 2018133304 A | 8/2018 |
| JP | 2019012681 A | 1/2019 |
| JP | 2019175847 A | 10/2019 |
| JP | 2019530967 A | 10/2019 |
| KR | 2009117419 A | 11/2009 |
| WO | 2018212436 A1 | 11/2018 |

* cited by examiner

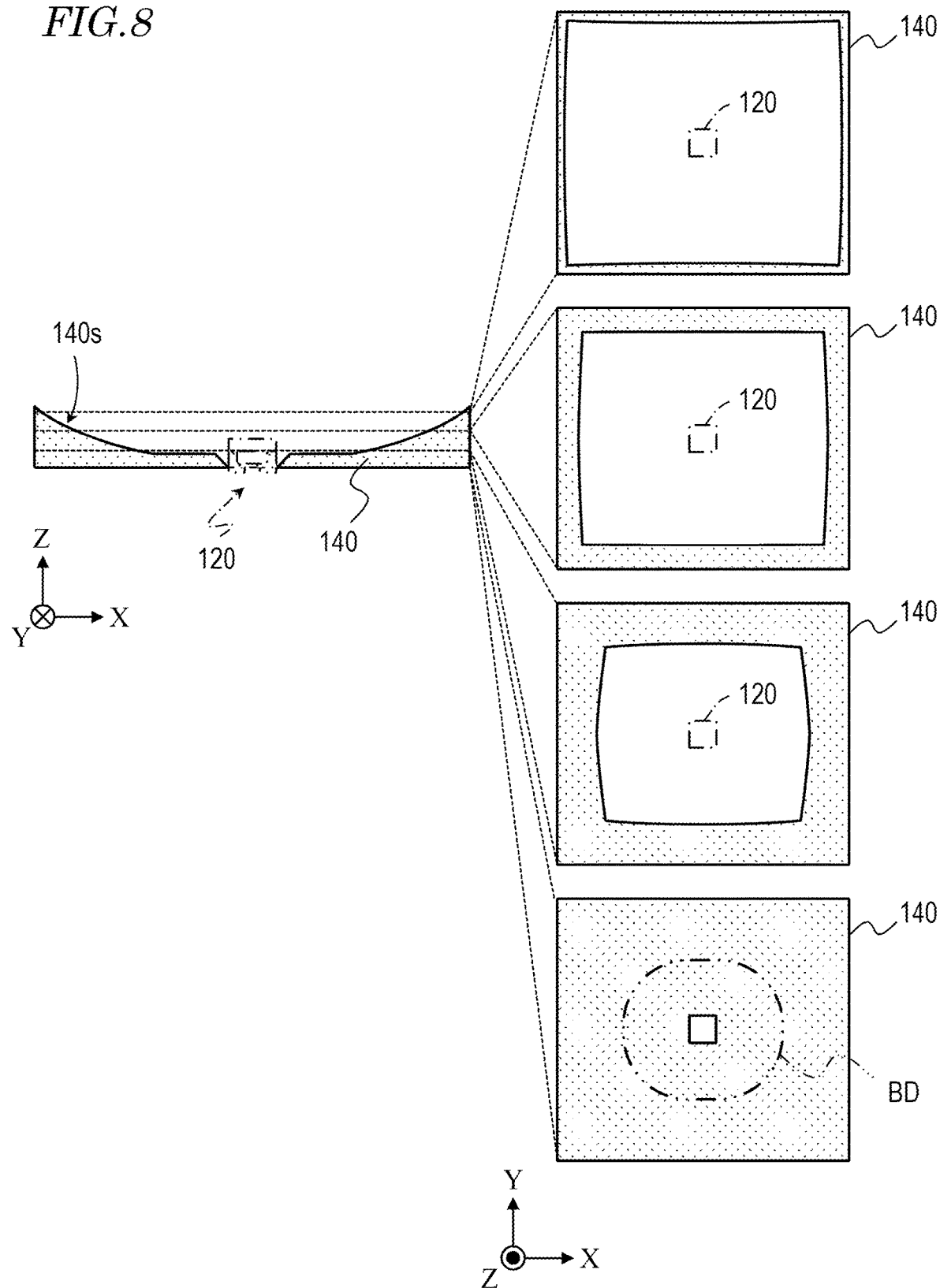

LIGHT-EMITTING MODULE AND SURFACE-EMITTING LIGHT SOURCE

CROSS-REFERENCE TO RELATED APPLICATIONS

This is a continuation application of U.S. patent application Ser. No. 17/005,297, filed Aug. 27, 2020, which claims priority to Japanese Patent Application No. 2019-157972 filed on Aug. 30, 2019, and Japanese Patent Application No. 2020-075731 filed on Apr. 21, 2020, the disclosures of which are hereby incorporated by reference in their entireties.

BACKGROUND

The present disclosure relates to a light-emitting module. The present disclosure also relates to a surface-emitting light source including a plurality of light-emitting modules.

Japanese Patent Publication No. 2007-329114 discloses a surface-emitting device for a liquid-crystal display, the surface-emitting device including a light-guiding plate having a front surface and a back surface and an LED element disposed on the back surface of the light-guiding plate. In the surface-emitting device in Japanese Patent Publication No. 2007-329114, the front surface of the light-guiding plate has a recess directly above the LED element. In the technology disclosed in Japanese Patent Publication No. 2007-329114, light emitted from the LED element toward the front surface of the light-guiding plate is uniformly guided inside the light-guiding plate by total reflection from the lateral wall surface of the recess. Japanese Patent Publication No. 2007-329114 discloses that a larger light-emitting surface is obtained by two-dimensionally arranging sets of light-guiding plates and LED elements.

SUMMARY

It is beneficial to further reduce the thickness of a light-emitting module including a plurality of light sources, typically LEDs, while reducing luminance nonuniformity. Reducing the thickness of the light-emitting module enables, for example, an apparatus including the light-emitting module as a backlight to be further reduced in its size.

According to an embodiment, a light-emitting module includes a light-guiding plate, a light-emitting element, and a light-reflective layer. The light-guiding plate has an upper surface with a first hole and a lower surface opposite to the upper surface. The light-guiding plate has a rectangular shape in a top view. The light-emitting element is disposed at the lower surface of the light-guiding plate and opposite to the first hole. The first hole has a first portion; and a second portion between the first portion and the upper surface of the light-guiding plate. The light-reflective layer is located in the first portion of the first hole. The first portion is a depression having a shape of an inverted cone, inverted pyramid, or inverted frustum of a cone or pyramid. The depression has a first opening at a boundary between the first portion and the second portion and a first lateral surface inclined with respect to the upper surface of the light-guiding plate. A shape of the first opening in a top view is define by a first axis parallel to a short side of the rectangular shape of the light-guiding plate and a second axis parallel to a long side of the rectangular shape and shorter than the first axis.

According to at least one of certain embodiments in the present disclosure, a slim light-emitting module that offers improved uniformity of light is provided.

BRIEF DESCRIPTION OF THE DRAWINGS

FIG. 8 schematically shows a light-reflective member in the light-emitting module shown in FIG. 2 and FIG. 3 and a plurality of end surfaces parallel to the XY-plane of the drawing obtained by cutting the light-reflective member at different heights.

DETAILED DESCRIPTION

Figure 1:
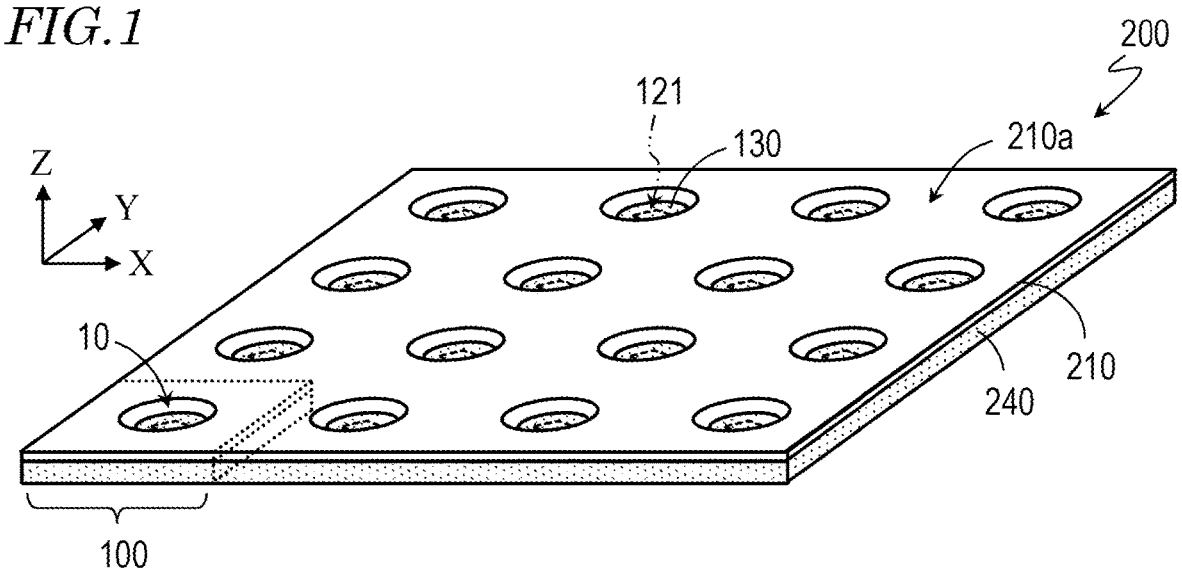
FIG. 1 is a schematic perspective view of an illustrative structure of a surface-emitting light source according to an embodiment in the present disclosure.

Embodiments of the present disclosure will be described below with reference to the accompanying drawings. Embodiments below are intended to give examples and do not limit light-emitting modules and surface-emitting light sources in the present disclosure. For example, the numerical values, shapes, materials, steps, the order of the steps, and the like described regarding the embodiments below are only examples and can be modified in various ways as long as technical contradictions do not arise. The embodiments described below are only intended to give examples and can be combined in various ways as long as technical contradictions do not arise.

The dimensions, shapes, and the like of the components shown in the drawings may be exaggerated for ease of explanation, and may not represent the dimension, the shape, and the size relationship between components in an actual light-emitting modules and surface-emitting light sources. The illustration of the components may be partly omitted to prevent the drawings from being too complicated.

In the description below, components having substantially the same function will be shown with the same reference numerals, and repeated descriptions of such components may be omitted. In the description below, terms representing particular directions or positions (e.g., "upper", "lower", "right", "left", and other terms including these words) may be used. These terms are used merely for the sake of ease of explanation, representing relative directions or relative positions in the referenced drawings. As far as the relative directions or positions mentioned by the terms "upper", "lower", and the like designate the same directions or positions in the reference drawings, drawings other than shown in the present disclosure, actual products, and manufacturing equipment may not have the same arrangement as shown in the reference drawings. The term "parallel" as used in the present disclosure indicates that an angle between two straight lines, sides, or planes is in the range of about 0°±5° unless otherwise stated. Further, the term "perpendicular" or "orthogonal" as used in the present disclosure indicates that an angle between two straight lines, sides, or planes is in the range of about 90°±5° unless otherwise stated.

Embodiments of Surface-Emitting Light Source

FIG. 1 schematically shows an illustrative structure of a surface-emitting light source according to an embodiment in the present disclosure. A surface-emitting light source 200 shown in FIG. 1 includes a light-guiding plate 210 having an upper surface 210a, and a plurality of light-emitting elements 121 located closer to the surface opposite to the upper surface 210a of the light-guiding plate 210. In the illustrative structure shown in FIG. 1, the overall shape of the upper surface 210a of the light-guiding plate 210 is rectangular in a top view. The surface-emitting light source 200 further includes a light-reflective member 240 in the form of a layer located below the light-guiding plate 210 and is approximately plate-shaped as a whole. FIG. 1 also shows arrows indicating the X direction, the Y direction, and the Z direction orthogonal to one another for ease of description. The X direction and the Y direction respectively correspond to one and the other sides of the rectangular shape of the upper surface 210a orthogonal to each other. The arrows indicating these directions may be shown also in other drawings in the present disclosure.

In the example shown in FIG. 1, the upper surface 210a of the light-guiding plate 210 constitutes the light-emitting surface of the surface-emitting light source 200. The length of each side of the rectangular shape of the upper surface 210a is in the range of, for example, 1 cm or more and 200 cm or less. In a typical embodiment in the present disclosure, each side of the rectangular shape of the upper surface 210a of the light-guiding plate 210 has a length of 20 mm or more and 25 mm or less. The rectangular shape of the upper surface 210a can respectively have lengths, for example, about 24.3 mm and 21.5 mm, in the length and width directions.

As indicated by the dotted lines in FIG. 1, the surface-emitting light source 200 is a collective body of a plurality of light-emitting modules 100 each of which includes at least one light-emitting element. In the illustrative structure shown in FIG. 1, the surface-emitting light source 200 includes a total of 16 light-emitting modules 100 two-dimensionally arranged. The 16 light-emitting modules 100 are arranged in a four-by-four matrix. The number of the light-emitting modules 100 included in the surface-emitting light source 200 and the arrangement of the light-emitting modules 100 can be appropriately selected and are not limited by the structure shown in FIG. 1.

Each of the light-emitting modules 100 is provided with a first hole 10 defining an opening at the upper surface 210a of the light-guiding plate 210, and includes a light-reflective layer 130 inside the first hole 10. As described below in detail, the light-emitting element 121 in each light-emitting module 100 is disposed substantially directly below the first hole 10. Accordingly, in this example, the light-emitting elements 121 are arranged in a four-by-four matrix along the X direction and the Y direction, corresponding to the four-by-four arrangement of the light-emitting modules 100. The arrangement pitch of the light-emitting elements 121 can be, for example, about 0.05 mm or more and 20 mm or less, or can be in the range of about 1 mm or more and 10 mm or less. The expression "arrangement pitch of the light-emitting elements 121" as used herein refers to the distances between the optical axes of the light-emitting elements 121. The light-emitting elements 121 can be disposed at regular intervals or irregular intervals. The arrangement pitches of the light-emitting elements 121 along two different directions can be the same or different.

Figure 2:
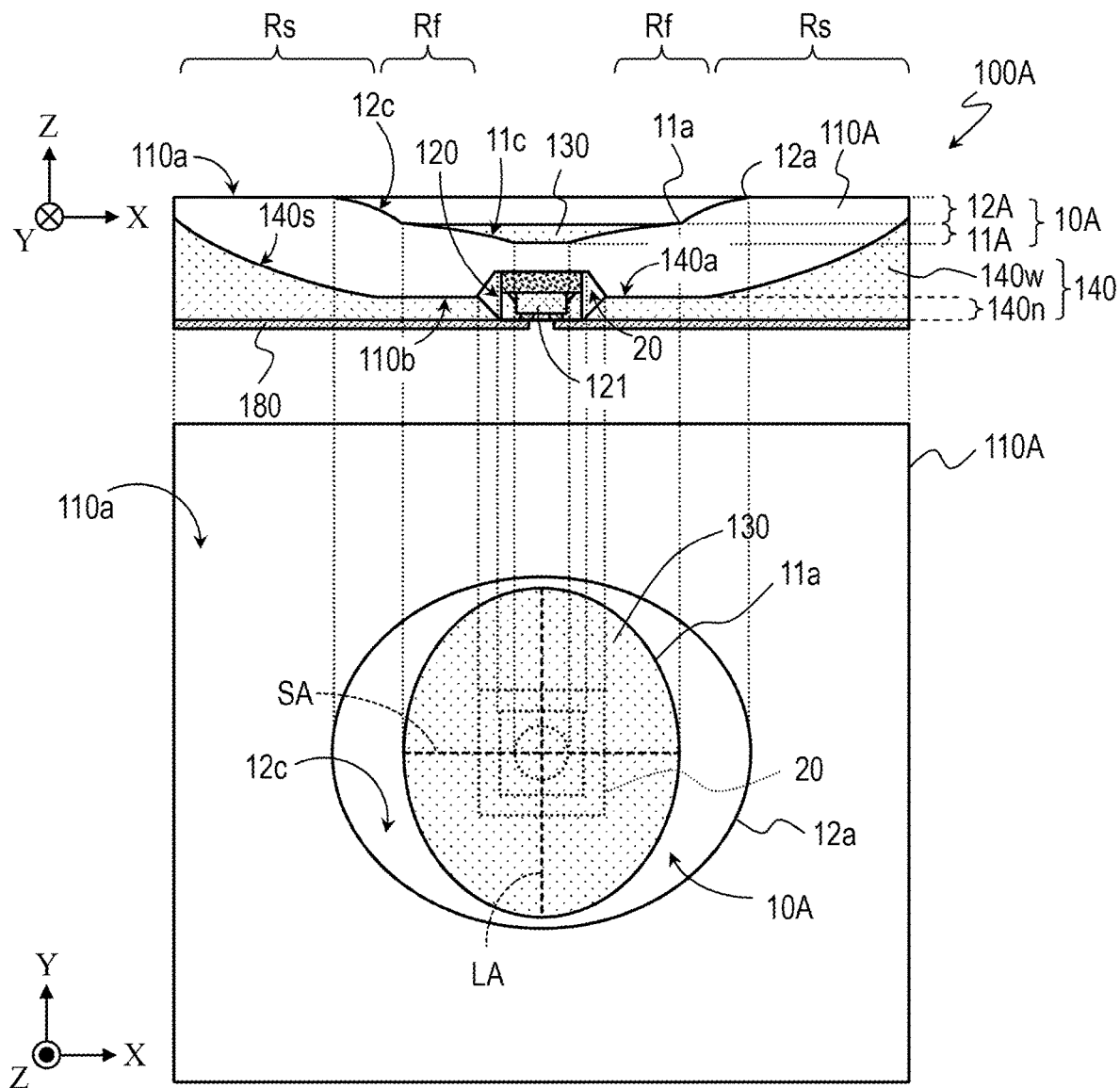
FIG. 2 schematically shows a cross section and an illustrative appearance when viewed from the upper surface of a light-guiding plate of an illustrative light-emitting module shown in FIG. 1.

FIG. 2 schematically shows a light-emitting module according to an embodiment of the present disclosure. A light-emitting module 100A shown in FIG. 2 is an example of the light-emitting module 100 described referring to FIG. 1. FIG. 2 schematically shows both of a cross section of the light-emitting module 100A cut near the center of the light-emitting module 100A and perpendicularly to the upper surface 210a of the light-guiding plate 210, and an illustrative appearance of the light-emitting module 100A when viewed perpendicularly to the upper surface 210a from the upper surface 210a of the light-guiding plate 210.

As shown in the upper part of FIG. 2, the light-emitting module 100A includes a light-guiding plate 110A, a light-emitting body 120 containing the light-emitting element 121, the light-reflective layer 130, and a light-reflective member 140. The light-guiding plate 110A has an upper surface 110a and a lower surface 110b opposite to the upper surface 110a, and the light-reflective member 140 is located closer to the lower surface 110b of the light-guiding plate 110A. The light-guiding plate 110A and the light-reflective member 140 respectively constitute part of the light-guiding plate 210 and part of the light-reflective member 240 shown in FIG. 1. The light-guiding plates 110A of two adjacent light-emitting modules 100A in the surface-emitting light source 200 can be formed as a single continuous light-guiding plate. In a case in which, for example, each of the light-emitting modules 100A includes an independent light-guiding plate 110A, a clear boundary may be observed between the light-guiding plates 110A of the two light-emitting modules 100A in the surface-emitting light source 200.

The upper surface 110a of the light-guiding plate 110A is provided with a first hole 10A at about the center of the upper surface 110a. The first hole 10A is an example of the first hole 10 described above. That is, the first hole 10A of the light-guiding plate 110A shown in FIG. 2 is one of a plurality of first holes 10 shown in FIG. 1. On the other hand, the lower surface 110b of the light-guiding plate 110A is provided with a second hole 20 opposite to the first hole 10A. The light-emitting body 120 is located inside the second hole 20 in a bottom view.

As shown in the drawing, the first hole 10A at the upper surface 110a of the light-guiding plate 110A includes two portions: a first portion 11A and a second portion 12A. The first portion 11A of the first hole 10A is located closer to the lower surface 110b of the light-guiding plate 110 than the second portion 12A is, and has a first opening 11a at the boundary between the first portion 11A and the second portion 12A, and has a first lateral surface 11c inclined with respect to the upper surface 110a of the light-guiding plate 110A. In the present embodiment, the light-reflective layer 130 is located in the first portion 11A of the first hole 10A. The interface between the light-guiding plate 110A and the light-reflective layer 130 functions as a surface that reflects light emitted from the light-emitting element 121 and guided to the light-guiding plate 110. That is, light emitted from the light-emitting element 121 toward the upper surface 110a of the light-guiding plate 110A can be diffused into the light-guiding plate 110A by reflection at the first lateral surface 11c of the first portion 11A.

The second portion 12A of the first hole 10A is a portion of the first hole 10A located between the first portion 11A and the upper surface 110a of the light-guiding plate 110. The second portion 12A has a second opening 12a located at the upper surface 110a of the light-guiding plate 110 and a second lateral surface 12c located between the second opening 12a and the first opening 11a of the first portion 11A.

While the light-reflective layer 130 is located inside the first portion 11A, resin or other substance can not be located inside the second portion 12A of the first hole 10A, but an air layer can be formed inside thereof. In other words, the inside of the second portion 12A has a refractive index lower than the refractive index of the inside of the first portion 11A. In this example, the second lateral surface 12c of the second portion 12A is the interface between the air layer and the light-guiding plate 110A, and functions as a reflecting surface at which light guided into the light-guiding plate 110A and traveling toward the first hole 10A is returned into the light-guiding plate 110A. That is, light incident substantially perpendicularly to the upper surface 110a of the light-guiding plate 110A can be diffused into the light-guiding plate 110A by the second lateral surface 12c of the second portion 12A. It is not required in the embodiment in the present disclosure that the air layer be formed inside the second portion 12A. The second portion 12A can be filled with a substance having a refractive index lower than the refractive index of the material of the light-reflective layer 130.

As shown in the lower part of FIG. 2, in the embodiment in the present disclosure, the first opening 11a of the first portion 11A can have an oval shape, not a perfect circle, in a top view. The expression "oval shape" as used in the present specification refers to a closed curve having two symmetry axes orthogonal to each other, and is broadly interpreted such that shapes such as elliptic shapes, oblong shapes, and rounded rectangular shapes are included. For example, in the case of an elliptic shape, the two symmetry axes orthogonal to each other are the major axis and the minor axis of the ellipse. An oblong shape among the "oval shapes" refers to a figure formed by connecting two circles with the same radius by common external tangents. The expression "oval shapes" as used in the present specification includes a composite figure composed of an elliptic shape and an oblong shape. The expression "oval shapes" as used in the present specification does not include perfect circles. An elliptic shape will be described as an example of the oval shape.

In the illustrative structure shown in FIG. 2, the first opening 11a has an elliptic shape defined by a first major axis which is a first axis, and a first minor axis which is a second axis orthogonal to the first major axis. The first major axis (indicated by the broken line LA in FIG. 2) of the elliptic shape of the first opening 11a is parallel to the Y direction in the drawing, and the first minor axis (indicated by the broken line SA in FIG. 2) is parallel to the X direction in the drawing. The first major axis and the first minor axis intersect each other at about the center of the light-guiding plate 110 in a top view, and the light-emitting element 121 is disposed at the lower surface 110b of the light-guiding plate 110A such that its optical axis passes through the intersection point of these axes.

In a typical embodiment in the present disclosure, the light-guiding plate 110A of each light-emitting module 100A also has a rectangular shape in a top view, corresponding to the rectangular shape of the upper surface 210a of the light-guiding plate 210 constituting the light-emitting surface of the surface-emitting light source 200. In the example shown in FIG. 2, the upper surface 110a of the light-guiding plate 110A has a wide rectangular shape longer in the X direction than in the Y direction of the drawing. That is, in this example, the first major axis defining the elliptic shape of the first opening 11a is parallel to the short sides of the rectangular shape of the light-guiding plate 110A, and the first minor axis of the elliptic shape of the first opening 11a is parallel to the long sides of the rectangular shape of the light-guiding plate 110A.

In the embodiment in the present disclosure, the first portion, in which the light-reflective layer 130 is disposed, of the first hole 10 at the upper surface 110a of the light-guiding plate 110 has an oval shape elongated in the direction in which the short sides of the rectangular shape of the light-guiding plate 110 extend as described above. According to the investigation by the present inventors, the surface-emitting device disclosed in Japanese Patent Publication No. 2007-329114 described above having a structure in which a rectangular light-guiding plate having a back surface on which an LED element is disposed, and having a front surface on which a recess is formed at a position corresponding to the LED element, luminance non-uniformity becomes more likely to occur particularly in the vicinity of the outer edges of the light-guiding plate, as the rectangular shape of the light-guiding plate deviates from a square. More specifically, the luminance is likely to be high near the centers of the long sides of the rectangular shape of the light-guiding plate, as the aspect ratio of the light-guiding plate increases in a top view.

On the other hand, in the embodiment in the present disclosure, the first portion of the first hole 10 of the light-guiding plate 110 has an oval shape elongated in the direction in which the short sides of the rectangular shape of the light-guiding plate 110 extend as described above. The distance between the first lateral surface 11c of the first portion of the first hole 10 and a short-side lateral surface of the rectangular shape of the light-guiding plate 110 increases. Accordingly, the luminance is reduced particularly near the centers of the long sides of the rectangular shape of the light-guiding plate 110 when viewed from the upper surface 110a, and the luminance uniformity can be enhanced while increase in the thickness of the light-emitting module 100 is inhibited.

Each component of the light-emitting module 100A will be described below in more detail.

Light-Guiding Plate 110A

The light-guiding plate 110A has a function of diffusing light emitted from the light-emitting element 121 and outputting the light from the upper surface 110a. The light-guiding plate 110A is an substantially plate-shaped light-transmissive member formed of a thermoplastic resin such as an acrylic resin, a polycarbonate, a cyclic polyolefin, polyethylene terephthalate, and a polyester, a thermosetting resin such as an epoxy and a silicone, or glass. Among these materials, particularly a polycarbonate can exhibit high transparency at low cost. The light-guiding plate 110A can have a light-diffusing function because of, for example, dispersion of a material having a refractive index different from the refractive index of a base material. The terms "light-transmissive" and "transmits light" as used in the present specification are not limited to "transparent" but are interpreted such that diffusibility of incident light is also included.

The first hole 10A at the upper surface 110a of the light-guiding plate 110A has a function of reflecting light emitted from the light-emitting element 121 and introduced from the lower surface 110b side of the light-guiding plate 110A and diffusing the light in the plane of the light-guiding plate 110A. With the first hole 10A serving as such a light-diffusing body in the light-guiding plate 110A, the luminance in a region of the upper surface 110a other than the region directly above the light-emitting element 121 can be enhanced. That is, luminance non-uniformity on the upper surface of the light-emitting module 100A can be reduced, so that the first hole 10A contributes to size reduction of the light-guiding plate 110A. The thickness of the light-guiding plate 110A, or the distance between the lower surface 110b and the upper surface 110a, is typically about 0.1 mm or more and 5 mm or less. In the embodiment in the present disclosure, the thickness of the light-guiding plate 110A can be about 0.6 mm or less.

Figure 3:
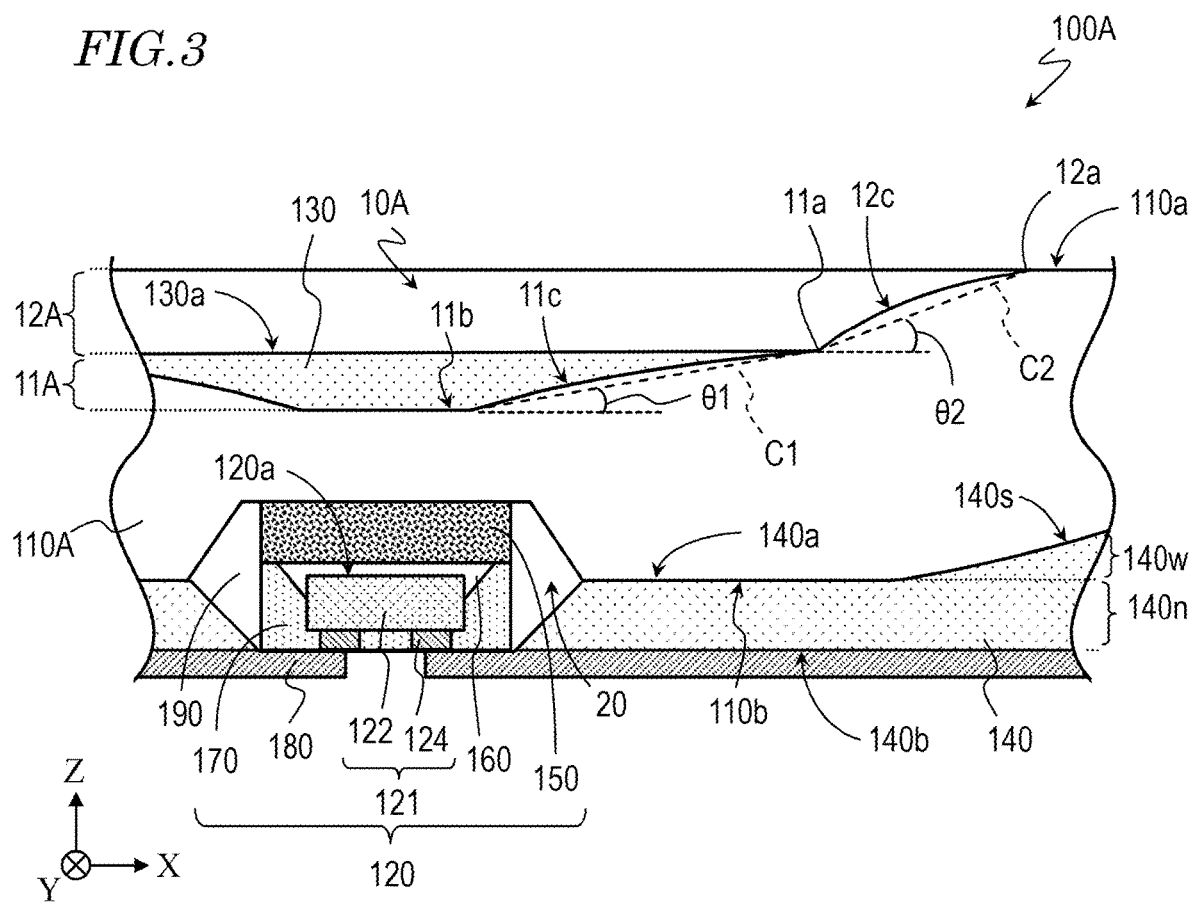
FIG. 3 is a schematic enlarged view of a light-emitting body and its vicinity in FIG. 2.

FIG. 3 is a schematic enlarged view of the light-emitting body 120 and its vicinity in FIG. 2. In the embodiment in the present disclosure, the first hole 10A of the light-guiding plate 110A has the first portion 11A and the second portion 12A as described above. In the illustrative structure shown in FIG. 3, the first portion 11A of the first hole 10A has a bottom surface 11b substantially parallel to the upper surface 110a of the light-guiding plate 110A in addition to the first lateral surface 11c. The first opening 11a of the first portion 11A has an oval shape, but the bottom surface 11b of the first portion 11A has a circular shape in a plan view as indicated by the dotted line in FIG. 2. That is, in this example, the first portion 11A of the first hole 10A is a depression having the shape of an inverted frustum of a cone formed in the upper surface 110a of the light-guiding plate 110A. The diameter of the circular shape of the bottom surface 11b is, for example, about 0.3 mm.

The shape of the bottom surface 11b in a top view is not limited to the circular shape but can be an oval shape such as an elliptic shape or a polygonal shape. That is, the first hole 10A of the light-guiding plate 110A can have the shape of an inverted frustum of a pyramid having a plurality of lateral surfaces. Alternatively, the first portion 11A may not have the bottom surface parallel to the upper surface 110a of the light-guiding plate 110A. In other words, the first portion 11A can be a depression having the shape of an inverted cone or inverted pyramid.

The second portion 12A of the first hole 10A is located between the first portion 11A and the upper surface 110a of the light-guiding plate 110, and has the second opening 12a as described above. Typically, the second opening 12a has an oval shape in a top view, similarly to the first opening 11a of the first hole 10A. A third axis and a fourth axis shorter than the third axis orthogonal to each other characterizing the oval shape of the second opening 12a are respectively parallel to the long sides and the short sides of the rectangular shape of the light-guiding plate 110A. That is, the first opening 11a of the first portion 11A of the first hole 10A has a shape in which a perfect circle is elongated along the short direction of the rectangular shape of the light-guiding plate 110A, but the second opening 12a of the second portion 12A has a shape in which a perfect circle is elongated along the longitudinal direction of the rectangular shape of the light-guiding plate 110A.

In the example shown in FIG. 2, the second opening 12a has an elliptic shape, similarly to the first opening 11a of the first portion 11A. That is, the third axis and the fourth axis of the second opening 12a respectively correspond to the major axis and the minor axis defining the elliptic shape of the second opening 12a. The ratio between the length along a first symmetry axis (the major axis in this example) and the length along a second symmetry axis (the minor axis in this example) of the second opening 12a of the second portion 12A can also be determined according to the aspect ratio of the rectangular shape of the light-guiding plate 110A. For example, the ratio between the length along the first symmetry axis and the length along the second symmetry axis of the second opening 12a of the second portion 12A can be 16:10.

The second portion of the first hole 10 closer to the upper surface 110a of the light-guiding plate has an oval shape that is relatively long in the direction in which the long sides of the rectangular shape of each light-emitting module extend in the illustrative structure in FIG. 2, so that light inside the light-guiding plate can be more readily diffused in a direction parallel to the long sides of the rectangular shape. This can allow light to be more uniformly diffused in the plane of the light-guiding plate, and therefore reduction in luminance due to increase in distance from the light-emitting element 121 is compensated. This can result in reduction of luminance non-uniformity on the upper surface 110a of the light-guiding plate.

Figure 4:
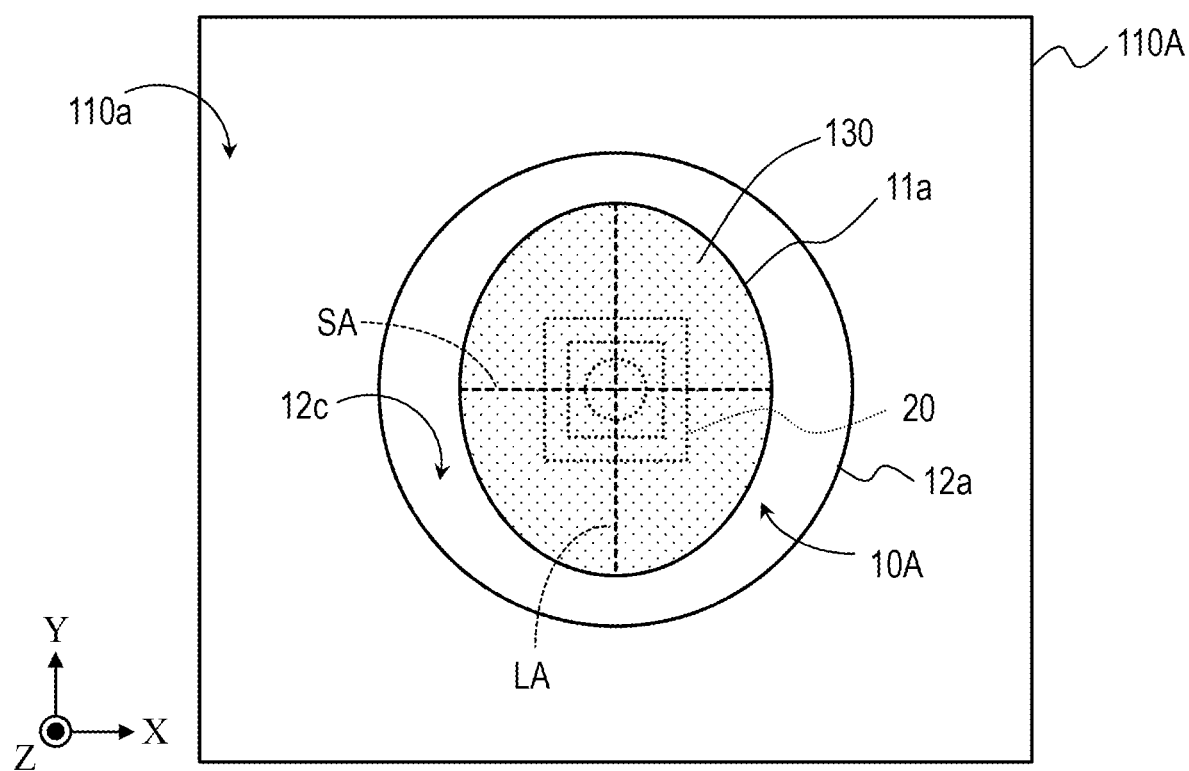
FIG. 4 is a schematic top view of another example of the shape of a second opening formed in the upper surface of the light-guiding plate.

The shape of the second opening 12a in the top view is not limited to a shape having a major axis and a minor axis orthogonal to each other. As shown in FIG. 4, the shape of the second opening 12a in the top view can be a perfect circle centered on the position of the light-emitting element 121.

As shown in FIG. 3, the inclination of the first lateral surface 11c with respect to the upper surface 110a of the light-guiding plate 110A is gentler than the inclination of the second lateral surface 12c with respect to the upper surface 110a in this example. Such a shape of the first hole 10A can increase the area of the first lateral surface 11c while inhibiting increase in the depth of the first hole 10A. Accordingly, light incident on the first lateral surface 11c of the light-guiding plate 110A can be more effectively diffused in the light-guiding plate 110A while avoiding increase in the thickness of the light-guiding plate 110A.

The degree of inclination of the first lateral surface 11c can be determined as an angle between a straight line parallel to the upper surface 110a of the light-guiding plate 110A and a line segment connecting the lower end and the upper end of the first lateral surface 11c in a cross-sectional view. Similarly, the inclination of the second lateral surface 12c can be determined as an angle between a straight line parallel to the upper surface 110a of the light-guiding plate 110A and a line segment connecting the lower end and the upper end of the second lateral surface 12c in a cross-sectional view.

In the illustrative structure shown in FIG. 3, both of the first lateral surface 11c and the second lateral surface 12c are curved in a cross-sectional view. In such a case, the degrees of inclination of these lateral surfaces can be determined as described below.

In the example shown in FIG. 3, the first portion 11A of the first hole 10A has the bottom surface 11b, and a line segment C1 is defined which connects the boundary between the first opening 11a and a connection portion of the bottom surface 11b and the first lateral surface 11c. Accordingly, in this example, an angle θ1 between the line segment C1 and a straight line parallel to the upper surface 110a of the light-guiding plate 110A can be employed as the degree of inclination of the first lateral surface 11c as shown in FIG. 3. A line segment C2 is defined which connects the first opening 11a and the second opening 12a. Similarly, an angle θ2 between the line segment C2 and a straight line parallel to the upper surface 110a of the light-guiding plate 110A can be employed as the degree of inclination of the second lateral surface 12c. The first portion 11A formed in the light-guiding plate 110A can be a depression having the shape of an inverted cone or inverted pyramid. In such a case, an angle between a straight line parallel to the upper surface 110a of the light-guiding plate 110A and a line segment connecting a portion, or the apex of the inverted cone or inverted pyramid, of the first portion 11A closest to the lower surface 110b of the light-guiding plate 110A and the first opening 11a can be regarded as the degree of inclination of the first lateral surface 11c.

As described above, the inclination of the first lateral surface 11c with respect to the upper surface 110a of the light-guiding plate 110A is gentler than the inclination of the second lateral surface 12c with respect to the upper surface 110a. In other words, in the example shown in FIG. 3, the angle between the upper surface 110a of the light-guiding plate 110A and the line segment C1 indicated by the broken line in FIG. 3 is smaller than the angle between the upper surface 110a of the light-guiding plate 110A and the line segment C2 indicated by the broken line in FIG. 3. That is, the relation θ1<θ2 holds. Conversely, the inclination of the second lateral surface 12c with respect to the upper surface 110a of the light-guiding plate 110A can be gentler than the inclination of the first lateral surface 11c. In other words, the angle between the upper surface 110a of the light-guiding plate 110A and the line segment C1 indicated by the broken line in FIG. 3 can be greater than the angle between the upper surface 110a of the light-guiding plate 110A and the line segment C2 indicated by the broken line in FIG. 3. That is, the relation θ1>θ2 may hold. Such a constitution can increase the capacity of the second portion 12A while avoiding increase in the thickness of the light-guiding plate 110A. For example, the air layer in the first hole 10A can therefore spread over a larger area. Accordingly, the larger amount of light enters the second lateral surface 12c, and light can be more effectively diffused in the plane of the light-guiding plate 110A.

The first lateral surface 11c and the second lateral surface 12c have curved shapes in a cross-sectional view in this example. However, the shapes of the first lateral surface 11c and the second lateral surface 12c in a cross-sectional view are not limited to curved shapes, but can be shapes including bends and/or steps or the shape of straight lines. The shape of the first lateral surface 11c does not have to correspond to the shape of the second lateral surface 12c in a cross-sectional view. The first lateral surface 11c and/or the second lateral surface 12c have curved shapes, particularly curved shapes convex toward the inside of the first hole 10A, as shown in FIG. 3 in a cross-sectional view. Such a configuration can facilitate diffusion of light to a position distant from the center of the light-guiding plate 110A, whereby uniform light distribution can be achieved on the upper surface 110a.

The specific shape of the first hole 10A is not limited to the shape shown in FIG. 3, but can be appropriately selected according to the shape and properties of the light-emitting element disposed at the lower surface 110b of the light-guiding plate 110A. For example, the depth of the first hole 10A, or the distance from the bottom surface 11b of the first portion 11A to the upper surface 110a of the light-guiding plate 110A along the Z direction of the drawings, is in the range of 200 μm or more and 400 μm or less. The depth of the first portion 11A can be in the range of, for example, 80 μm or more and 200 μm or less.

The ratio between the lengths along the two symmetry axes of the oval shape of the first opening 11a of the first portion 11A can be determined on the basis of the ratio (aspect ratio) between the length of the long sides and the length of the short sides of the rectangular shape of the light-guiding plate 110A. For example, in the case in which the aspect ratio of the rectangular shape of the light-guiding plate 210 of the surface-emitting light source 200 is 16:10 and in which the surface-emitting light source 200 includes a four-by-four array of 16 light-emitting modules 100A, the rectangular shape of the light-guiding plate 110A of each light-emitting module 100A can have the same aspect ratio as the rectangular shape of the light-guiding plate 210. The ratio between the length along the first symmetry axis (such as the first major axis) and the length along the second symmetry axis (such as the first minor axis) of the first opening 11a of the first portion 11A can be 16:10 corresponding to the aspect ratio of the rectangular shape of the light-guiding plate 110A. Alternatively, the ratio of the length along the first symmetry axis with respect to the length along the second symmetry axis of the first opening 11a of the first portion 11A can be in the range of (6.0/5.5) to (2/1). For example, the size of the first opening 11a of the first portion 11A along the long sides or the short sides of the rectangular shape of the light-guiding plate 110A can be in the range of about 2 mm to about 2.5 mm. For example, the size of the second opening 12a of the second portion 12A along the long sides or the short sides of the rectangular shape of the light-guiding plate 110A can be in the range of about 3 mm to about 4 mm.

The light-guiding plate 110A is provided with the second hole 20 in the lower surface 110b at a position opposing the first hole 10A. A bonding member 190 and the light-emitting body 120 are located inside the second hole 20. In the illustrative structure shown in FIG. 3, the light-emitting body 120 includes a plate-shaped wavelength conversion member 150, a bonding member 160, and a second light-reflective member 170 in addition to the light-emitting element 121. The light-emitting body 120 is bonded onto the second hole 20 of the light-guiding plate 110A with the bonding member 190.

As shown in FIG. 2, the second hole 20 has, for example, the shape of a frustum of a quadrangular pyramid. Typically, the center of the second hole 20 located at the lower surface 110b of the light-guiding plate 110A substantially corresponds to the center of the first hole 10A located at the upper surface 110a. The light-guiding plate 210 of the surface-emitting light source 200 can be formed by injection molding, transfer molding, thermal transfer, or the like. The cross-sectional shape as shown in FIG. 2 can be accurately formed by using a mold provided with projections which project from an inner wall of the cavity and are provided at predetermined positions inside the cavity. That is, molding method using a mold allows the centers of the second holes 20 to comparatively easily correspond to the centers of the respective first holes 10A.

In the case in which each of the second holes 20 has a rectangular shape in a bottom view, the second hole 20 can be formed at the lower surface 110b of the light-guiding plate 110A such that a side of its rectangular shape is parallel to a side of the rectangular shape of the light-guiding plate 110A as shown in FIG. 2. Alternatively, the second hole 20 at the lower surface 110b of the light-guiding plate 110A can be formed such that a side of the rectangular outer shape is inclined with respect to a side of the rectangular shape of the light-guiding plate 110A in a bottom view. For example, the second hole 20 at the light-guiding plate 110A can be formed such that a side of the rectangular shape of the opening of the second hole 20 is substantially parallel to a diagonal line of the rectangular shape of the light-guiding plate 110A.

The shape of the second hole 20 in a bottom view can be circular instead of the rectangular. The shape and size of the second hole 20 can be appropriately selected according to desired optical properties. For example, the second hole 20 can have the shape of a frustum of a cone. The size of the opening of the second hole 20 formed at the lower surface 110b of the light-guiding plate 110A can be, for example, 0.05 mm or more and 10 mm or less, preferably 0.1 mm or more and 1 mm or less. For example, in the case in which the second hole 20 has a rectangular opening in a bottom view, the size of the opening of the second hole 20 is the length of the rectangular shape along the direction of the diagonal line. In the case in which the second hole 20 has a circular opening in a bottom view, the size of the second hole 20 is the diameter of the circular shape.

Figure 5:
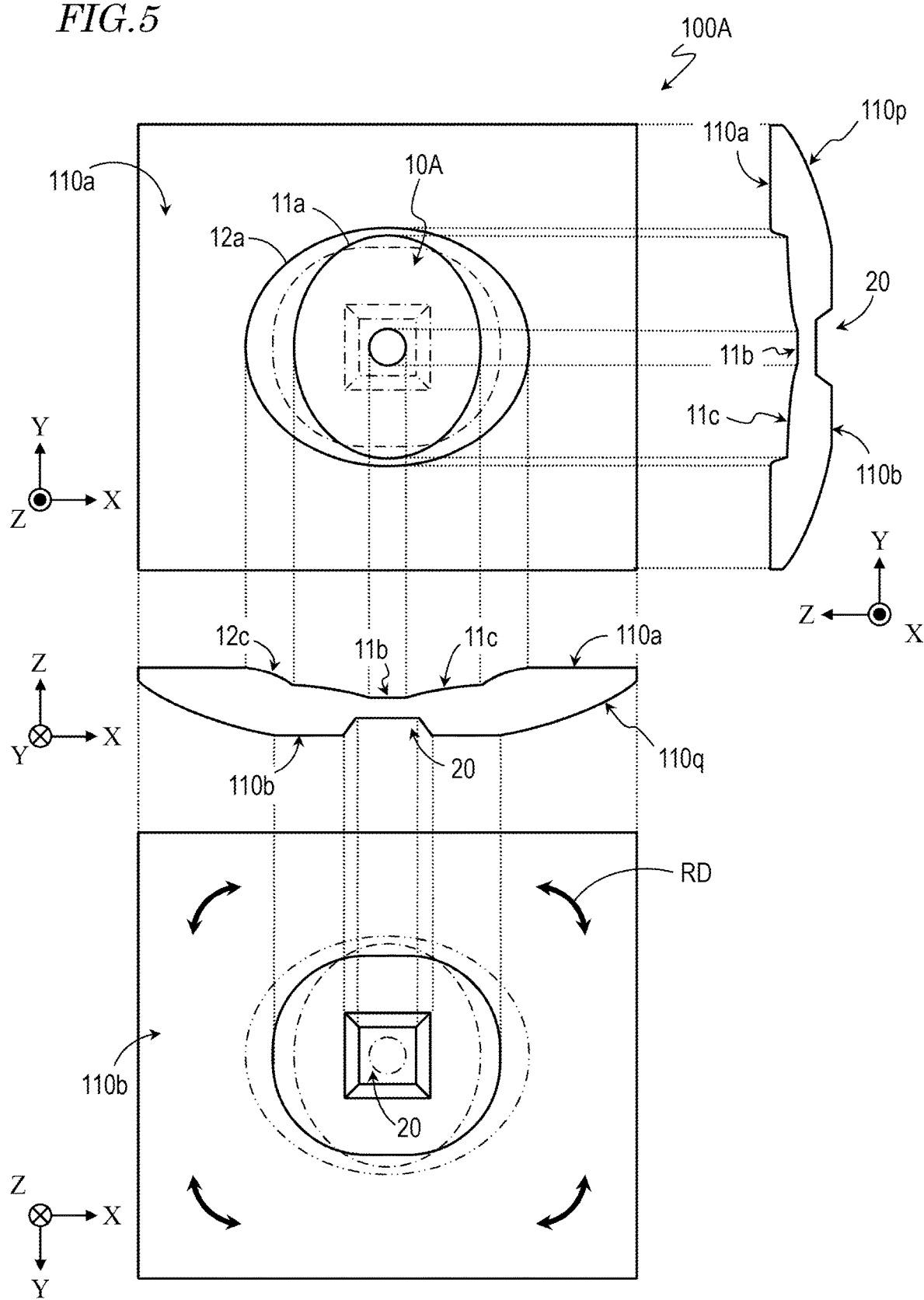
FIG. 5 schematically shows the light-guiding plate taken out from the light-emitting module shown in FIG. 2.

FIG. 5 schematically shows the light-guiding plate 110A taken out from the light-emitting module 100A shown in FIG. 2. FIG. 5 schematically shows an end surface of the light-guiding plate 110A obtained by cutting the light-guiding plate 110A parallel to the YZ-plane of the drawing and an end surface of the light-guiding plate 110A obtained by cutting the light-guiding plate 110A parallel to the ZX-plane of the drawing, in addition to the appearance of the light-guiding plate 110A when viewed from the upper surface 110a (i.e., in a top view) and the appearance when viewed from the lower surface 110b (i.e., in a bottom view).

As can be seen from the illustrative shapes of the end surfaces shown in FIG. 5, the lower surface 110b of the light-guiding plate 110A includes curved surfaces 110p and curved surfaces 110q that connect the portion substantially parallel to the upper surface 110a to the lateral surfaces substantially perpendicular to the upper surface 110a in the present embodiment. The curved surfaces 110p are located between the lateral surfaces substantially parallel to the ZX-plane in the drawing among the four lateral surfaces of the light-guiding plate 110A and the portion of the lower surface 110b substantially parallel to the upper surface 110a. On the other hand, the curved surfaces 110q are located between the lateral surfaces substantially parallel to the YZ-plane in the drawing among the rest of two lateral surfaces of the light-guiding plate 110A and the portion of the lower surface 110b substantially parallel to the upper surface 110a. As schematically indicated by the bold, solid, double-headed arrows RD in the lowermost part of FIG. 5, the curved surfaces 110p are smoothly connected to the curved surfaces 110q, and no clear boundaries are formed between the curved surfaces 110p and the curved surfaces 110q in the present embodiment. In other words, structures like ridges are not formed on the virtual lines connecting the corners of the rectangular shape of the light-guiding plate 110A to the center of the light-guiding plate 110A when viewed from the lower surface 110b of the light-guiding plate 110A (i.e., in a bottom view).

Light-Reflective Layer 130

In the present embodiment, the light-reflective layer 130 is located in the first portion 11A of the first hole 10A. In the present embodiment, the light-reflective layer 130 occupies the entire first portion 11A inside the first hole 10A. The light-reflective layer 130 is formed of a light-reflective material such as metal or resin in which a light-reflective filler is dispersed. The light-reflective layer 130 can be a dielectric multilayer film.

The term "reflective" or "light-reflective" as used in the present specification indicates that the reflectance at the peak emission wavelength of light emitted from the light-emitting element 121 is 60% or more. It is more beneficial that the reflectance of the light-reflective layer 130 with respect to the peak emission wavelength of light emitted from the light-emitting element 121 be 70% or more, and it is further beneficial that the reflectance be 80% or more.

With the light-reflective layer 130 disposed above the light-emitting element 121, light that is emitted from the light-emitting element 121 and travels toward the upper surface 110a of the light-guiding plate 110A can be reflected at the light-reflective layer 130 near the center of the light-guiding plate 110A. Accordingly, light emitted from the light-emitting element 121 can be efficiently diffused in the plane of the light-guiding plate 110A. Also, the luminance in the region of the upper surface 110a of the light-guiding plate 110A directly above the light-emitting element 121 may be inhibited from being locally and excessively high. It is not required that the light-reflective layer 130 completely block light emitted from the light-emitting element 121. In this sense, the light-reflective layer 130 can have a semi-transmissive property of transmitting part of light emitted from the light-emitting element 121.

The interface between the light-reflective layer 130 and the light-guiding plate 110 is not a completely reflecting surface. In other words, the light-reflective layer 130 reflects part of light diffused into the light-guiding plate 110 and absorbs part of the light. Hence, even in the case, such as the present embodiment, in which an oval shape that is relatively long in the direction along the short sides of the rectangular shape of the light-guiding plate 110 is employed as the shape of the first portion 11A of the first hole 10A, excessive increase in luminance near the centers of the long sides of the rectangular shape of the light-guiding plate 110 can be avoided by utilizing absorption by the light-reflective layer 130. In other words, this may inhibit luminance non-uniformity caused by positioning the interface between the light-reflective layer 130 and the light-guiding plate 110 close to the outer edges of the light-guiding plate 110.

In the case in which the light-reflective layer 130 is formed of a light-reflective resin material, the light-reflective layer 130 can be formed by, for example, the light-reflective resin material is supplied in the first portion 11A with a dispenser and curing the applied material with heat, light, or the like. As the base material of the resin material used for forming the light-reflective layer 130, a silicone resin, a phenolic resin, an epoxy resin, a BT resin, polyphthalamide (PPA), or the like can be used. As the light-reflective filler, metal particles or particles of an inorganic or organic material having a refractive index higher than the refractive index of the base material can be used. Examples of the light-reflective filler include particles of titanium dioxide, silicon oxide, zirconium dioxide, potassium titanate, aluminum oxide, aluminum nitride, boron nitride, mullite, niobium oxide, or barium sulfate and particles of rare-earth oxides such as yttrium oxide and gadolinium oxide. It is beneficial that the light-reflective layer 130 be white in color.

Figure 6:
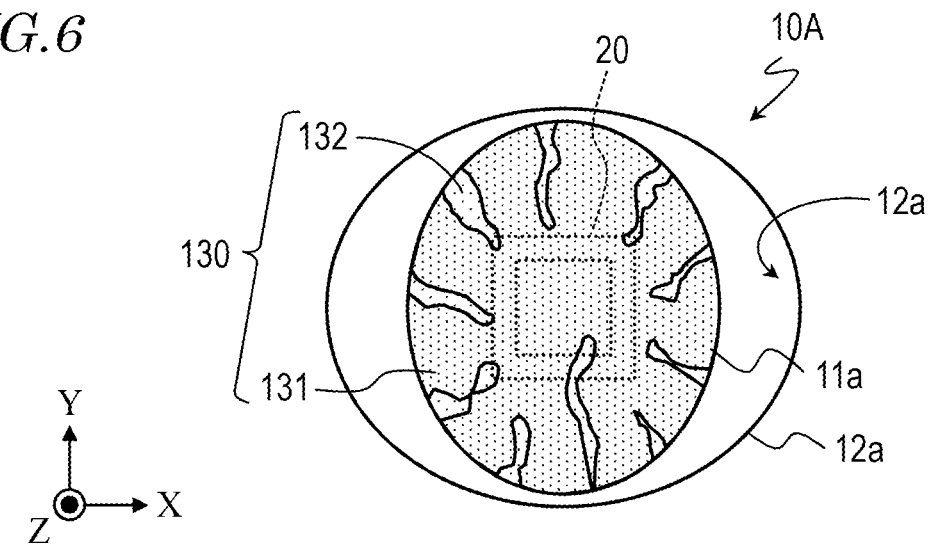
FIG. 6 is a schematic enlarged view of the vicinity of a first hole viewed in the normal direction to the upper surface of the light-guiding plate to show an illustrative shape of a light-reflective layer.
Figure 7:
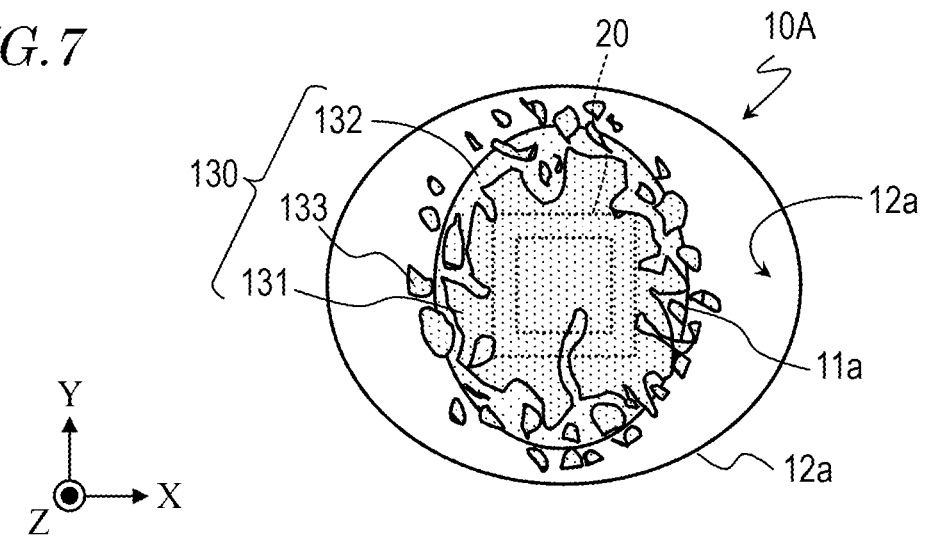
FIG. 7 is a schematic enlarged view of the vicinity of the first hole viewed in the normal direction to the upper surface of the light-guiding plate to show another illustrative shape of the light-reflective layer.

The distribution of the light-reflective filler in the light-reflective layer 130 can be substantially even or uneven inside the light-reflective layer 130, or there can be a gradient. For example, the distribution of the light-reflective filler in the light-reflective layer 130 can be uneven due to sedimentation or separation from the base material of the filler before the base material is cured in a step of forming the light-reflective layer 130. For example, the light-reflective layer 130 can have a first region 131 and a second region 132 that has a relatively low concentration of the filler as shown in FIG. 6. In the example shown in FIG. 6, a plurality of second regions 132 extend toward the center of the first hole 10A from the outer edge of the first hole 10A. Alternatively, the light-reflective layer 130 can include a plurality of island portions 133 near the first opening 11a of the first portion 11A as in the example shown in FIG. 7.

It is beneficial that the number density of the filler defined by the number of particles of the filler per unit area in a top view be high near the center compared with the number density near the outer edge of the light-reflective layer 130 because the luminance in the region directly above the light-emitting element 121 is easily inhibited from being locally and excessively high. In both of the examples shown in FIG. 6 and FIG. 7, the number density of the filler is high near the center compared with the number density near the outer edge of the light-reflective layer 130. It is not required in the embodiment in the present disclosure that the entire first portion 11A be filled with the light-reflective layer 130.

It is sufficient that the light-reflective layer 130 occupies part of the first portion 11A. For example, the light-reflective layer 130 can be formed inside the first hole 10A so as to cover the first lateral surface 11c of the first portion 11A.

As shown in FIG. 3, an upper surface 130a of the light-reflective layer 130 is substantially flat in this example. The shape of the upper surface 130a of the light-reflective layer 130 is not limited to this example, but can be a convex shape projecting opposite to the light-emitting element 121 or a depressed shape recessed toward the light-emitting element 121. In particular, if the upper surface 130a of the light-reflective layer 130 has a convex shape projecting opposite to the light-emitting element 121, the thickness of the light-reflective layer 130 near the center on the basis of the position of the first opening 11a of the first portion 11A is relatively large, so that the luminance in the region directly above the light-emitting element 121 may be more effectively inhibited from being locally and excessively high.

Light-Emitting Element 121

A typical example of the light-emitting element 121 is an LED. In the illustrative structure shown in FIG. 3, the light-emitting element 121 includes an element body 122 and electrodes 124 located opposite to an upper surface 120a of the light-emitting element 121. For example, the element body 122 includes a supporting substrate formed of sapphire or gallium nitride and a semiconductor layers on the supporting substrate. The semiconductor layers include an n-type semiconductor layer, a p-type semiconductor layer, and an active layer interposed between these layers. The semiconductor layers can contain a nitride semiconductor ($In_xAl_yGa_{1-x-y}N$, where $0 \le x$, $0 \le y$, and $x+y \le 1$) that can emit light in the ultraviolet to visible range. In this example, the upper surface of the element body 122 is configured as the upper surface 120a of the light-emitting element 121. The electrodes 124 include a set of positive and negative electrodes and have a function of supplying a predetermined current to the semiconductor layers.

Each of the light-emitting elements 121 disposed in the surface-emitting light source 200 can be an element that emits blue light or an element that emits white light. A plurality of light-emitting elements 121 can include elements that emit light having different colors. For example, the light-emitting elements 121 can include an element that emits red light, an element that emits blue light, and an element that emits green light. An LED that emits blue light is described as an example of the light-emitting element 121 in this example.

The light-emitting element 121 in each light-emitting module 100A is fixed on the lower surface side of the wavelength conversion member 150 using the bonding member 160 in the form of the light-emitting body 120 including the wavelength conversion member 150 and other members. In this example, the light-emitting element 121 is located inside the second hole 20 in a plan view. The optical axis of the light-emitting element 121 substantially corresponds to the center of the first hole 10A.

The light-emitting element 121 typically has a rectangular shape in a bottom view. The length of a side of the rectangular shape of the light-emitting element 121 is, for example, 1,000 μm or less. The length and width dimensions of the rectangular shape of the light-emitting element 121 can be 500 μm or less. Light-emitting elements having length and width dimensions of 500 μm or less are available at low prices. Alternatively, the length and width dimensions of the rectangular shape of the light-emitting element 121 can be 200 μm or less. It is advantageous that the length of a side of the rectangular shape of the light-emitting element 121 be small in terms of expression of high-definition images, local dimming, and the like in the case of application to a backlight unit of a liquid-crystal display. In particular, a light-emitting element having length and width dimensions that are both 250 µm or less has a smaller area of the upper surface, and therefore amount of light emitted from the lateral surfaces of the light-emitting element becomes relatively large. Accordingly, a batwing light distribution characteristic is likely to be obtained. In a broad sense, the expression "batwing light distribution characteristic" as used herein refers to a light distribution characteristic defined by such an emission intensity distribution that the emission intensity is higher at large light distribution angles in absolute value than at 0°, which is the direction of the optical axis perpendicular to the upper surface of the light-emitting element.

Wavelength Conversion Member 150

In the illustrative structure shown in FIG. 3, the wavelength conversion member 150 in the light-emitting body 120 is located inside the second hole 20 and between the light-guiding plate 110A and the light-emitting element 121. In other words, the wavelength conversion member 150 is located above the light-emitting element 121 and at the bottom of the second hole 20. The expression "bottom of the second hole 20" as used herein refers to a portion corresponding to the bottom of the second hole 20 when the lower surface 110b of the light-guiding plate 110A is facing up. As described above, the terms "bottom" and "bottom surface" may be used regardless of the orientation of the light-emitting module shown in the drawings in the present specification. When the light-emitting module 100A lies in the orientation shown in FIG. 3, the bottom of the second hole 20 may be called the ceiling of the dome-like structure formed at the lower surface 110b of the light-guiding plate 110A.

The wavelength conversion member 150 absorbs at least part of light emitted from the light-emitting element 121 and emits light with wavelengths different from the wavelengths of light emitted from the light-emitting element 121. For example, the wavelength conversion member 150 converts part of blue light emitted from the light-emitting element 121, and emit yellow light. This structure can achieve white light as a mixture of blue light that has passed through the wavelength conversion member 150 and yellow light emitted from the wavelength conversion member 150. In the illustrative structure shown in FIG. 3, light emitted from the light-emitting element 121 is basically introduced into the light-guiding plate 110A through the wavelength conversion member 150. Accordingly, light after the color mixture is diffused inside the light-guiding plate 110A, so that light such as white light with reduced luminance non-uniformity can be extracted from the upper surface 110a of the light-guiding plate 110A. The present embodiment is more advantageous in order to make the light uniform than the case in which light is subjected to wavelength conversion after being diffused into the light-guiding plate.

The wavelength conversion member 150 is typically a member in which phosphor particles are dispersed in resin. For the resin in which the particles of the phosphor or the like are to be dispersed, a silicone resin, a modified silicone resin, an epoxy resin, a modified epoxy resin, a urea resin, a phenolic resin, an acrylic resin, a urethane resin, a fluorocarbon resin, or a resin containing two or more of these resins can be used. In view of efficiently introducing light into the light-guiding plate 110A, it is beneficial that the base material of the wavelength conversion member 150 have a refractive index lower than the refractive index of the material of the light-guiding plate 110A. A material with a refractive index different from the refractive index of the base material can be dispersed into the material of the wavelength conversion member 150 to allow the wavelength conversion member 150 to diffuse light. For example, particles of titanium dioxide or silicon oxide can be dispersed into the base material of the wavelength conversion member 150.

A known material can be used for the phosphor. Examples of the phosphor include fluoride phosphors such as KSF based phosphors, nitride phosphors such as CASN, YAG based phosphors, and β-SiAlON based phosphors. KSF based phosphors and CASN based are examples of a wavelength conversion substance that converts blue light into red light, and YAG phosphors are examples of a wavelength conversion substance that converts blue light into yellow light. β-SiAlON phosphors are examples of a wavelength conversion substance that converts blue light into green light. The phosphor can be a quantum-dot phosphor.

It is not required that the same phosphor be contained in the wavelength conversion members 150 of a plurality of light-emitting modules 100 in the same surface-emitting light source 200. Phosphors dispersed in the base material of the wavelength conversion members 150 of a plurality of light-emitting modules 100 can be different from each other. It is also possible that wavelength conversion members that convert incident blue light into yellow light be disposed in some second holes 20 among a plurality of second holes 20 in the light-guiding plate 210 of the surface-emitting light source 200, and that wavelength conversion members that convert incident blue light into green light be disposed in other second holes 20. Further, wavelength conversion members that convert incident blue light into red light can be disposed in the remaining second holes 20.

Bonding Member 160

The bonding member 160 is a light-transmissive member covering at least part of the lateral surfaces of the light-emitting element 121. As schematically shown in FIG. 3, the bonding member 160 typically includes a portion in the form of a layer located between the upper surface 120a of the light-emitting element 121 and the wavelength conversion member 150.

A resin composition containing a transparent resin material as the base material can be used as the material of the bonding member 160. For example, the bonding member 160 has a light transmittance with respect to the peak emission wavelength of the light-emitting element 121 of 60% or more. In view of effective use of light, it is beneficial that the transmittance of the bonding member 160 having light transmittance with respect to the peak emission wavelength of the light-emitting element 121 be 70% or more, and it is more beneficial that the transmittance be 80% or more.

Typical examples of the base material of the bonding member 160 include thermosetting resins such as epoxy resins and silicone resins. A silicone resin, a modified silicone resin, an epoxy resin, a phenolic resin, a polycarbonate resin, an acrylic resin, a polymethylpentene resin, a polynorbornene resin, or a material containing two or more of these resins can be used as the base material of the bonding member 160. The bonding member 160 typically has a refractive index lower than the refractive index of the light-guiding plate 110A. The bonding member 160 can have a light-diffusing function because of, for example, dispersion of a material having a refractive index different from the refractive index of a base material.

As described above, the bonding member 160 covers at least part of the lateral surfaces of the light-emitting element 121. The bonding member 160 has an outer surface that is the interface between the bonding member 160 and the light-reflective member 170 described below. Light that has been emitted from the lateral surfaces of the light-emitting element 121 and entered the bonding member 160 is reflected at the position of the outer surface of the bonding member 160 toward a region above the light-emitting element 121. The shape of the outer surface of the bonding member 160 in a cross-sectional view is not limited to a straight linear shape as shown in FIG. 3. The shape of the outer surface of the bonding member 160 in a cross-sectional view can be a shape consisting of lines, a curved line convex toward the light-emitting element 121, or a curved line convex away from the light-emitting element 121.

(Second) Light-Reflective Member 170

The light-reflective member 170 is a light-reflective member located on the lower surface side of the wavelength conversion member 150 (a side opposite to the light-guiding plate 110A). As shown in FIG. 3, the light-reflective member 170 covers the outer surface of the bonding member 160, portions of the lateral surfaces of the light-emitting element 121 not covered with the bonding member 160, and a region of the lower surface, which is opposite to the upper surface 120a, of the light-emitting element 121 except for the electrodes 124. The light-reflective member 170 covers the lateral surfaces of the electrodes 124, while the lower surfaces of the electrodes 124 are exposed on the lower surface of the light-reflective member 170.

The same or a similar material as the material of the light-reflective layer 130 can be used as the material of the light-reflective member 170. For example, the light-reflective member 170 and the light-reflective layer 130 can be formed of the same or a similar material. With the light-reflective member 170 covering the region of the lower surface of the light-emitting element 121 except for the electrodes 124, leakage of light in the direction opposite to the upper surface 110a of the light-guiding plate 110A can be reduced. Further, covering the lateral surfaces of the light-emitting element 121 with the light-reflective member 170 enables light emitted from the light-emitting element 121 to be concentrated on the upper side and efficiently introduced into the wavelength conversion member 150.

Second Bonding Member 190

As described above, the light-emitting body 120 is disposed at the bottom of the second hole 20 using the second bonding member 190. The second bonding member 190 is at least partially located inside the second hole 20 as shown in FIG. 3. The second bonding member 190 can include a portion located between the bottom of the second hole 20 and the wavelength conversion member 150. The second bonding member 190 can include a portion protruding away from the upper surface 110a of the light-guiding plate 110A with respect to the lower surface 110b of the light-guiding plate 110A as shown in FIG. 3.

Similarly to the bonding member 160, the second bonding member 190 can be formed of a resin composition containing a transparent resin material as the base material. The material of the second bonding member 190 may be different from or the same as the material of the bonding member 160. The second bonding member 190 typically has a refractive index lower than the refractive index of the light-guiding plate 110A.

Light-Reflective Member 140

The light-reflective member 140 is light-reflective and covers at least part of the lower surface 110b of the light-guiding plate 110A. Similarly to the light-guiding plate 110A, the light-reflective member 140 can be continuously formed across two adjacent light-emitting modules 100A of the surface-emitting light source 200.

With the light-reflective member 140 disposed on the lower surface 110b of the light-guiding plate 110A, light traveling toward the lower surface 110b of the light-guiding plate 110A can be reflected at the interface between the light-guiding plate 110A and the light-reflective member 140 toward the upper surface 110a, so that light can be more efficiently extracted from the upper surface 110a of the light-guiding plate 110A. In particular, the light-reflective member 140 also covers the second bonding member 190 in addition to the lower surface 110b of the light-guiding plate 110A in this example. With the light-reflective member 140 covering the second bonding member 190, leakage of light from the second bonding member 190 toward the lower surface 110b of the light-guiding plate 110A can be reduced, so that the light extraction efficiency can be enhanced.

In the illustrative structure shown in FIG. 2 and FIG. 3, the light-reflective member 140 includes a base 140n in the form of a layer and a wall portion 140w rising in a direction from the lower surface 110b toward the upper surface 110a of the light-guiding plate 110A. Disposing the wall portion 140w at the periphery of the light-guiding plate 110A can inhibit the luminance at the periphery of the light-guiding plate 110A from being low relative to the luminance at the center.

As shown in FIG. 2, an upper surface 140a of the light-reflective member 140 has a shape that matches the lower surface 110b of the light-guiding plate 110A. The lower surface 110b of the light-guiding plate 110A includes a flat region Rf and an inclined region Rs surrounding the flat region Rf. The flat region Rf is substantially parallel to the upper surface 110a of the light-guiding plate 110A. On the other hand, the inclined region Rs of the lower surface 110b of the light-guiding plate 110A has a shape rising from the flat region Rf toward the upper surface 110a of the light-guiding plate 110A. In accordance with the flat region Rf and the inclined region Rs of the lower surface 110b of the light-guiding plate 110A, the upper surface 140a of the light-reflective member 140 includes an inclined surface 140s surrounding the light-emitting element 121. The inclined surface 140s is the upper surface of the wall portion 140w of the light-reflective member 140.

FIG. 8 schematically shows the light-reflective member 140 taken out from the light-emitting module 100A shown in FIG. 2 and FIG. 3. FIG. 8 also schematically shows a plurality of end surfaces parallel to the XY-plane of the drawing obtained by cutting the light-reflective member 140 at different heights.

As described referring to FIG. 5, the portion of the lower surface 110b of the light-guiding plate 110A substantially parallel to the upper surface 110a is connected to the lateral surfaces of the light-guiding plate 110A through the curved surfaces 110p or the curved surfaces 110q. As schematically indicated by the double dot dash line BD in the lowermost part of the right side of FIG. 8, the boundary between the flat region Rf and the inclined region Rs of the lower surface 110b has an oval shape such as an elliptic shape. In this example, the oval shape of the boundary between the flat region Rf and the inclined region Rs is longer in the direction along the long sides than in the direction along the short sides of the rectangular shape of the light-guiding plate 110A.

The light-reflective member 140 located on the lower surface 110*b* side of the light-guiding plate 110A has a function of reducing leakage of light from the lower surface 110*b* of the light-guiding plate 110A to enhance the utilization efficiency of light by allowing light traveling inside the light-guiding plate 110A toward the lower surface 110*b* to reflect toward the upper surface 110*a*. If the reflective member has four planar inclined surfaces surrounding the light-emitting element 121 along the four sides of the rectangular shape of the light-guiding plate 110A, a bend like a valley extending along a diagonal line of the rectangular shape of the light-guiding plate is formed at the boundary between two adjacent inclined surfaces. If such a bend like a valley is formed in the reflective member located on the lower surface side of the light-guiding plate, the luminance in the direction along the diagonal line of the rectangular shape is likely to be low compared with the luminance in the direction parallel to a side of the rectangular shape of the light-guiding plate.

On the other hand, the inclined surface 140*s* of the light-reflective member 140 has the smooth bowl shape in the present embodiment. In other words, the upper surface 140*a* of the light-reflective member 140 does not include the bend like a valley on a line connecting the center and each corner of the rectangular shape of the light-reflective member 140 in a top view.

The inclined surface 140*s* of the light-reflective member 140 is easily formed into a smooth bowl as a whole by forming the boundary between the flat region Rf and the inclined region Rs of the lower surface 110*b* of the light-guiding plate 110A into an oval shape. Straight linear bends or grooves in regions on the diagonal lines of the rectangular shape of the light-guiding plate is less likely to be formed by allowing the regions of the upper surface 140*a* of the light-reflective member 140 on the diagonal lines of the rectangular shape of the light-guiding plate to have curved surfaces as in the present embodiment. Accordingly, generation of dark portions on the diagonal lines of the rectangular shape of the light-guiding plate is less likely to be formed. In other words, the effect of reduction in luminance non-uniformity may be obtained by allowing the regions of the upper surface 140*a* of the light-reflective member 140 on the diagonal lines of the rectangular shape of the light-guiding plate to have curved surfaces.

The shape of the inclined surface 140*s* in a cross-sectional view can be a curved line as shown in FIG. 8 or a straight line, but is not limited to these shapes, and may include steps, bends, or the like.

The height of the wall portion 140*w* surrounding the light-emitting element 121 can vary between a plurality of light-emitting modules 100 in a single surface-emitting light source 200 or within a single light-emitting module 100. For example, among a plurality of inclined surfaces 140*s* included in a single surface-emitting light source 200, inclined surfaces 140*s* located at the outermost periphery of the light-guiding plate 210 of the surface-emitting light source 200 can have heights greater than the heights of inclined surfaces 140*s* located at the other portions of the light-guiding plate 210.

The same or a similar material as the material of the second light-reflective member 170 described above can be used as the material of the light-reflective member 140. If the light-reflective member 140 and the light-reflective member 170 are formed of the same or a similar material, an integrated light-reflective member substantially entirely covering the lower surface 110*b* of the light-guiding plate 110A can be formed using a light-reflective material. Forming the light-reflective member 140 on the lower surface 110*b* side of the light-guiding plate 110A also has the effect of reinforcing the light-guiding plate 110A and the like.

Wiring Layer 180

In the illustrative structure shown in FIG. 2 and FIG. 3, the light-emitting module 100A further includes a wiring layer 180 located on a lower surface 140*b* of the light-reflective member 140. The wiring layer 180 is electrically connected to the electrodes 124 of the light-emitting element 121 located opposite to the light-guiding plate 110A. As shown in the drawings, the wiring layer 180 in this example also includes a portion located on the light-reflective member 170.

The wiring layer 180 is typically a single-layer film or a layered film formed of metal such as Cu. The wiring layer 180 is connected to a power source (not shown) or the like to function as a terminal that supplies a predetermined current to each light-emitting element 121.

Figure 9A:
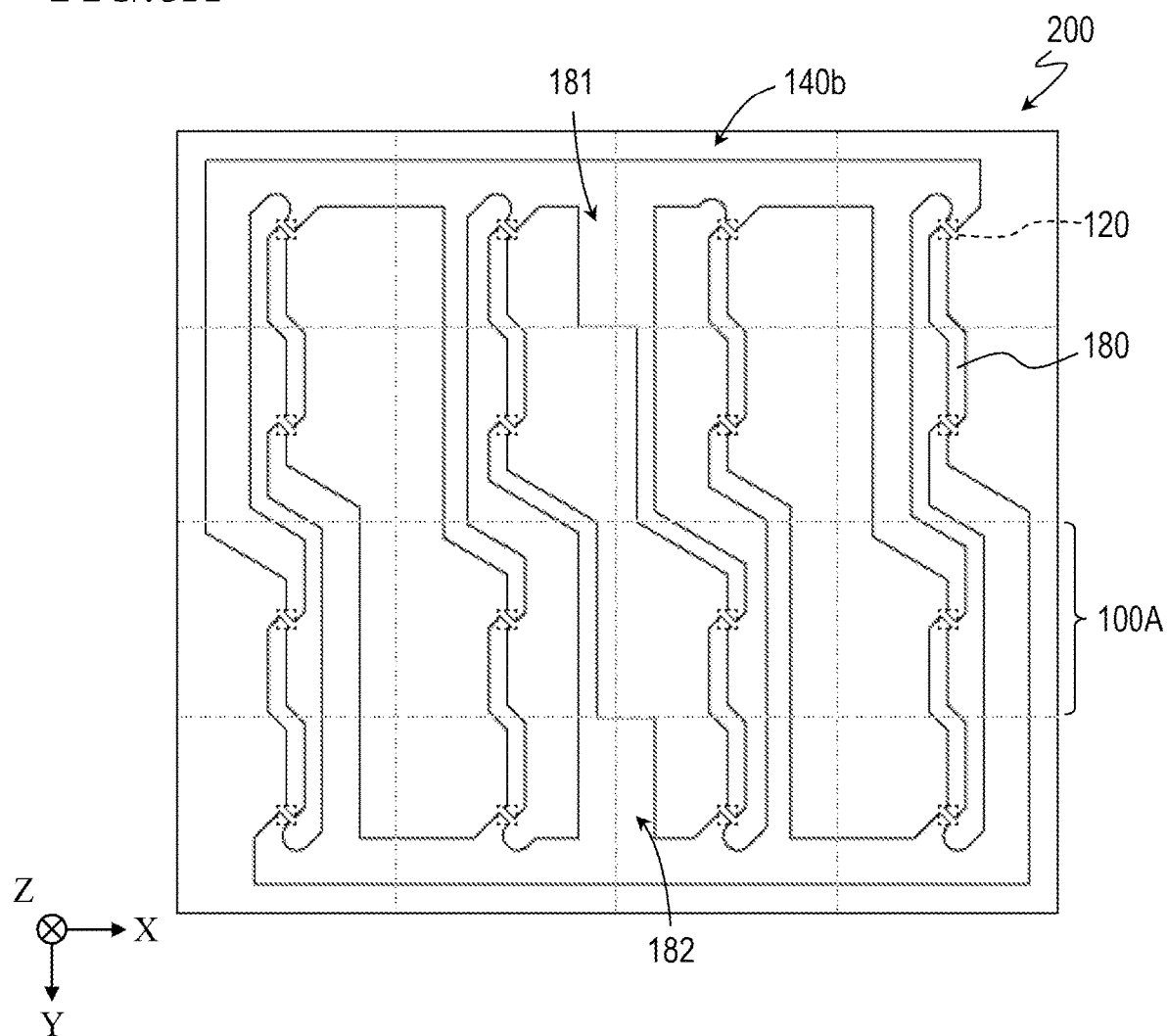
FIG. 9A is a schematic plan view of an illustrative appearance of the surface-emitting light source shown in FIG. 1 when viewed from the surface opposite to the upper surface of the light-guiding plate.

FIG. 9A schematically shows an illustrative appearance when viewed from the lower surface opposite to the upper surface 210*a* of the light-guiding plate 210 of the surface-emitting light source 200 shown in FIG. 1. The boundaries between a plurality of light-emitting modules 100A are indicated by the dotted lines in FIG. 9A to facilitate understanding, but it is not required in the embodiment in the present disclosure that clear boundaries be formed between a plurality of light-emitting modules 100A.

In the illustrative structure shown in FIG. 9A, the wiring layer 180 electrically connects the light-emitting elements 121 contained in the light-emitting bodies 120 of the respective light-emitting modules 100A. In this example, each light-emitting element 121 has a rectangular shape in a plan view, and a pair of portions of the wiring layer 180 connected to the positive and negative electrodes of each light-emitting element 121 extend in a diagonal direction of the rectangular shape of the light-emitting element 121.

The wiring pattern of the wiring layer 180 is appropriately selected according to the driving method of the surface-emitting light source 200. In this example, eight series circuits each including a series connection of two of the light-emitting elements 121 arranged in a four-by-four matrix are connected in parallel. Electrical connection of a plurality of light-emitting elements 121 is not limited to this example. For example, a plurality of light-emitting elements 121 in the surface-emitting light source 200 can be divided into two or more groups, and a circuit can be constituted such that the light-emitting elements 121 are driven in units of groups.

With the wiring layer 180 disposed below the lower surface of the light-emitting module 100A as described above, for example, a plurality of light-emitting elements 121 in the surface-emitting light source 200 are electrically connected to each other with ease. In particular, the wiring layer 180 includes a positive electrode 181 and a negative electrode 182 formed as portions of the wiring with comparatively large areas in the example shown in FIG. 9A. Such a structure enables electrical connection between a plurality of light-emitting elements 121 in the surface-emitting light source 200 and a driver or the like on a board supporting the surface-emitting light source 200 by electrically connecting the positive electrode 181 and the negative electrode 182 provided at the surface-emitting light source 200 side to the driver on the board with solder or the like without forming a complicated wiring pattern on the board.

Figure 9B:
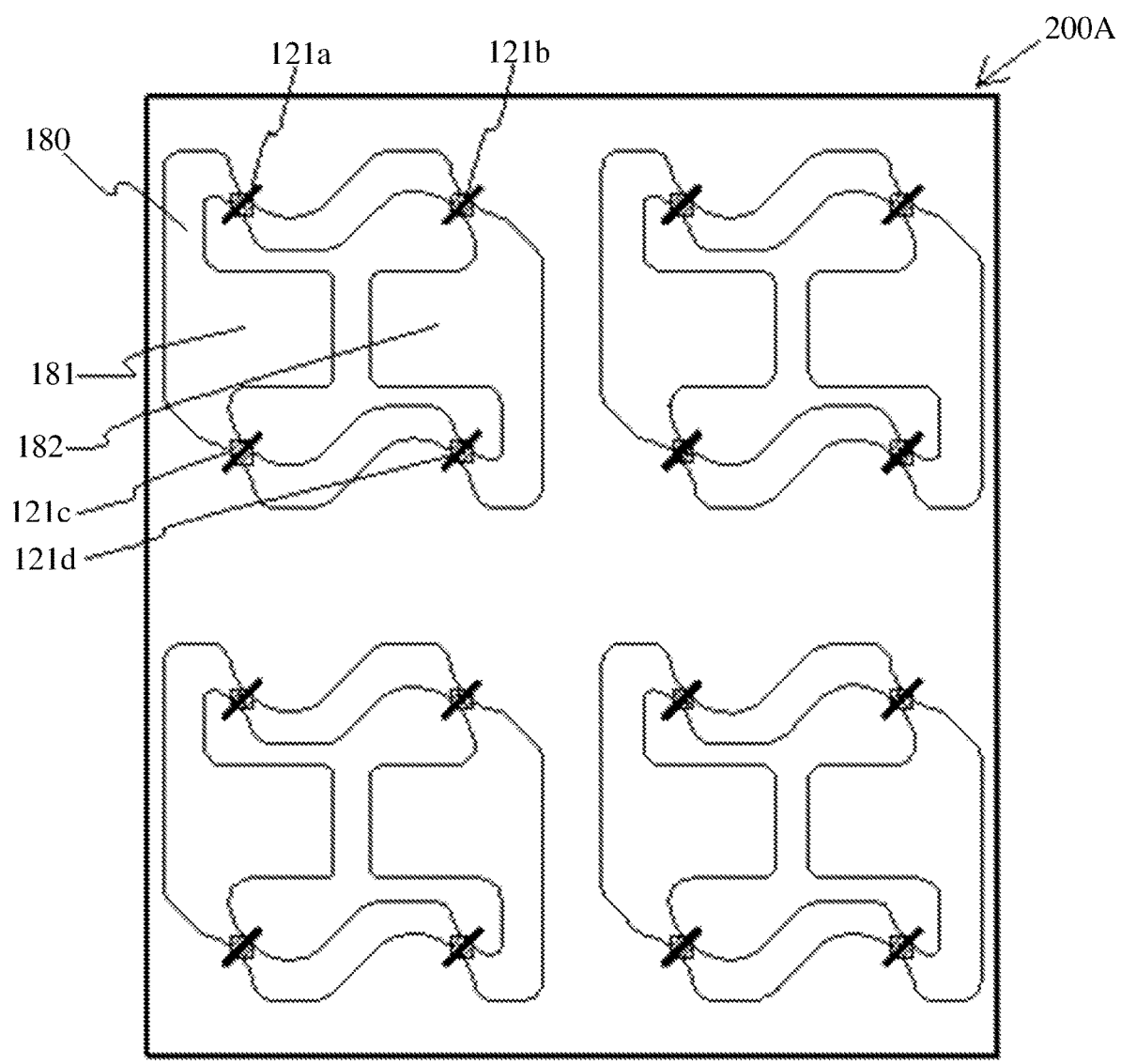
FIG. 9B is a schematic plan view of an illustrative appearance of another surface-emitting light source according to an embodiment in the present disclosure when viewed from the surface opposite to the upper surface of the light-guiding plate.

FIG. 9B schematically shows an illustrative external appearance of another surface-emitting light source when viewed from the surface opposite to the upper surface of the light-guiding plate. Similarly to the surface-emitting light source 200 described above, a surface-emitting light source 200A shown in FIG. 9B includes a total of 16 light-emitting modules arranged in a four-by-four matrix. In this example, the 16 light-emitting modules each of which includes the light-emitting element 121 are divided into four groups. Each group includes four light-emitting modules arranged in a two-by-two matrix. In this example, the wiring layer 180 constitutes such a circuit that allows the light-emitting modules included in the surface-emitting light source 200A to be driven in units of groups.

In the example shown in FIG. 9B, each of the groups including four light-emitting modules includes four light-emitting elements 121a 121b, 121c, 121d arranged in a two-by-two matrix. In this example, the wiring layer 180 constitutes a wiring pattern in which two series circuits each including two light-emitting elements 121 are connected in series are connected in parallel. That is, the light-emitting element 121a and the light-emitting element 121b are connected in series, the light-emitting element 121c and the light-emitting element 121d are connected in series, and these two series connections are connected in parallel.

In the example shown in FIG. 9B, a set of the positive electrode 181 and the negative electrode 182 is disposed for each group including four light-emitting modules. In this example, the positive electrode 181 and the negative electrode 182 are formed between the two series circuits each including two light-emitting elements. That is, in this example, the positive electrode 181 is located between the light-emitting element 121a and the light-emitting element 121c, and the negative electrode 182 is located between the light-emitting element 121b and the light-emitting element 121d.

For example, regarding the series circuit of the light-emitting element 121a and the light-emitting element 121b among the two light-emitting elements 121 connected in series, a portion of the wiring layer 180 connecting the light-emitting element 121a to the light-emitting element 121b has a meandering shape in this example. In other words, the portion of the wiring layer 180 connecting the light-emitting element 121a to the light-emitting element 121b has two bends. Similarly, a portion of the wiring layer 180 connecting the light-emitting element 121c to the light-emitting element 121d also has two bends in this example. The meandering shape of the portion of the wiring layer 180 connecting the light-emitting element 121a to the light-emitting element 121b is substantially the same as the meandering shape of the portion connecting the light-emitting element 121c to the light-emitting element 121d. It is advantageous that a portion of the wiring layer 180 connecting two or more light-emitting elements in series have a meandering shape as described in this example in that occurrence of cracks in the wiring layer 180 can be reduced in the case in which an external force that would cause a distortion of the surface-emitting light source 200A and the like is applied.

As shown in the drawing, the pair of portions of the wiring layer 180 connected to the electrodes of each light-emitting element 121 can extend in a diagonal direction of the rectangular shape of the light-emitting element 121. In this case, it is beneficial that one and the other one of the pair of portions connected to the light-emitting element 121 have shapes symmetrical about the diagonal direction (a direction extending from the upper right to the lower left or from the upper left to the lower right of the drawing in the example shown in FIG. 9B) of the rectangular shape of the light-emitting element 121. The influence of stress generated by formation of the wiring layer 180 may be reduced by forming the pair of portions of the wiring layer 180 connected to the electrodes of the light-emitting element 121 into shapes symmetrical about the diagonal direction of the rectangular shape of the light-emitting element 121. For example, in the case in which the wiring layer 180 is formed by applying and hardening electrically conductive paste, the influence of stress generated at the time of hardening the material of the wiring layer 180 can be reduced.

In the illustrative structure shown in FIG. 9B, a portion of the wiring layer 180 extending from the light-emitting element 121a toward the positive electrode 181 extends from the light-emitting element 121a in the diagonal direction of the rectangular shape of the light-emitting element 121a, then bends at an acute angle, and thereafter extends straight. On the other hand, a portion of the wiring layer 180 connecting the light-emitting element 121c to the positive electrode 181 extends from the light-emitting element 121c toward the positive electrode 181 in the diagonal direction of the rectangular shape of the light-emitting element 121c. The light-emitting element 121c is connected to the positive electrode 181 by a gentle curve, so that printing can be performed well in the case in which the wiring layer 180 is formed by printing, and a wiring layer with a desired thickness is easily obtained.

The wiring layer 180 can be a single layer or comprise multiple layers. In the case in which the wiring layer 180 to be formed is a layered film formed of two layers, a first layer of the wiring layer 180 is located on the light-guiding plate 210 side and connected to the electrodes of the light-emitting elements 121. A second layer of the wiring layer 180 is disposed on the surface of the first layer. The second layer of the wiring layer 180 may not cover the entire surface of the first layer. For example, regions of the surface of the first layer near portions in which the wiring layer 180 is connected to the light-emitting elements 121 can be exposed from the second layer in a top view. For example, edges of the second layer at the light-emitting element 121 side can overlap with the light-emitting elements 121, or can be located away from the light-emitting elements 121 in a plan view.

FIG. 9B schematically shows the illustrative surface-emitting light source 200A including an array of four groups each including four light-emitting elements 121 arranged in a two-by-two matrix. However, the arrangement of a plurality of groups each including a plurality of light-emitting modules in the surface-emitting light source and the structure of each group are not limited to the example shown in FIG. 9B. For example, the surface-emitting light source can be configured as a single group of light-emitting elements 121 arranged in a two-by-two matrix. The wiring pattern in each group is not limited to the example shown in FIG. 9B. A pattern obtained by rotating the wiring pattern shown in FIG. 9B 90° can also be employed as the wiring pattern of the wiring layer 180. At this time, the positions of the positive electrodes 181 and the negative electrodes 182 can also be rotated 90° relative to the example shown in FIG. 9B.

Figure 9C:
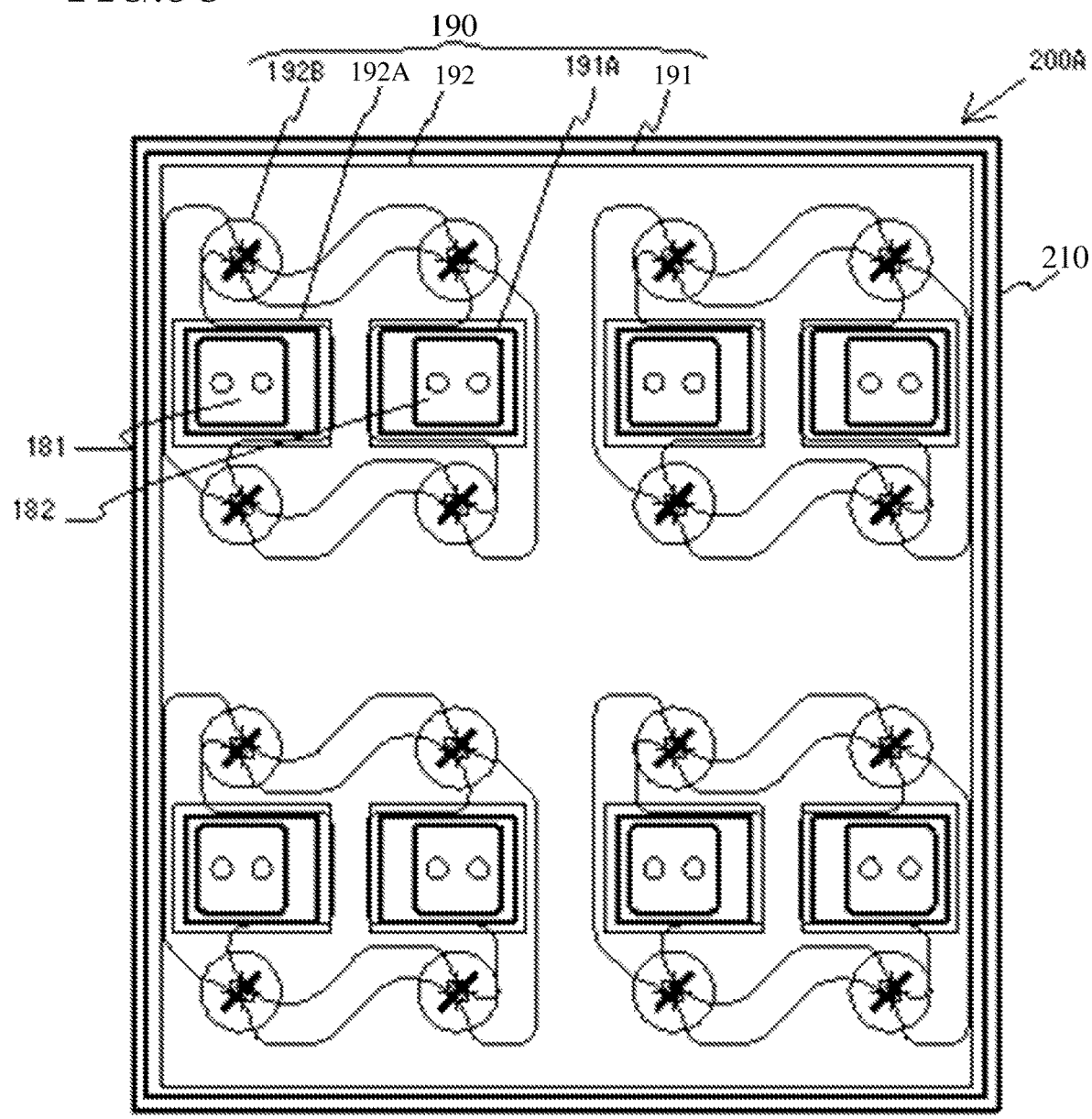
FIG. 9C is a schematic plan view of an example in which an insulating layer has been added on a wiring layer shown in FIG. 9B.

FIG. 9C schematically shows an example in which an insulating layer has been formed on the surface of the wiring layer 180. With an insulating layer 190 disposed on the surface of the wiring layer 180 as shown in FIG. 9C, the wiring layer 180 can be protected against water, dust, and the like. In the illustrative structure shown in FIG. 9C, the insulating layer 190 includes two-layers including a first layer 191 at the light-guiding plate 210 side and a second layer 192 disposed on the surface of the first layer 191. The first layer 191 of the insulating layer 190 has openings 191A at positions overlapping with the positive electrodes 181 and the negative electrodes 182 of the wiring layer 180 in a bottom view. The second layer 192 of the insulating layer 190 also has openings 192A at positions overlapping with the positive electrodes 181 and the negative electrodes 182 of the wiring layer 180 in a bottom view. The second layer 192 also has openings 192B at positions overlapping with the light-emitting elements 121 in a bottom view. In other words, the first layer 191 of the insulating layer 190 covers substantially the entire lower surface of the light-guiding plate 210 except for the regions of the wiring layer 180 overlapping with the positive electrodes 181 and the negative electrodes 182. The second layer 192 of the insulating layer 190 is disposed on the first layer 191 except for the regions of the wiring layer 180 overlapping with the positive electrodes 181 and the negative electrodes 182 and regions overlapping with the light-emitting elements 121. That is, the positive electrodes 181 and the negative electrodes 182 of the wiring layer 180 are not covered with the insulating layer 190 but are exposed from the insulating layer 190 at the lower surface of the light-guiding plate 210, and each light-emitting element 121 is selectively covered with the first layer 191 among the two-layers of the insulating layer 190.

The insulating layer 190 can include two layers as shown in FIG. 9C or can consist of a single-layer. The insulating layer 190 can be colorless or colored (such as blue). Also in the example shown in FIG. 9A, the insulating layer 190 can be disposed on the wiring layer 180. Also in this case, the insulating layer 190 can include two layers or can be a single layer.

Figure 9D:
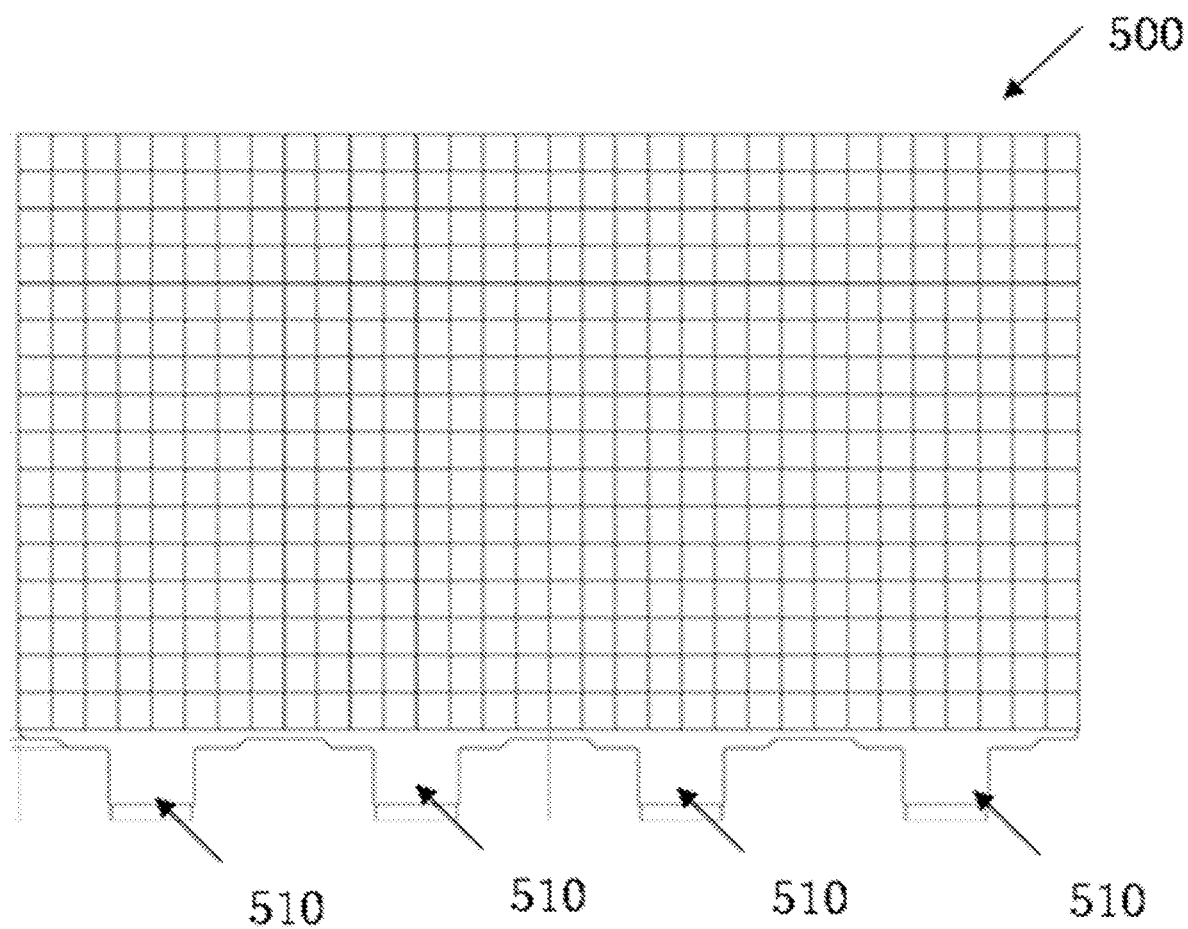
FIG. 9D is a schematic plan view of an example in which a plurality of surface-emitting light sources each having a wiring pattern shown in FIG. 9B are two-dimensionally arranged.

FIG. 9D schematically shows an example in which a plurality of surface-emitting light sources each having the wiring pattern shown in FIG. 9B are two-dimensionally arranged. FIG. 9D schematically shows an illustrative surface-emitting light source in which a total of 512 groups each including four light-emitting modules shown in FIG. 9B are arranged in 16 columns in the longitudinal direction and 32 rows in the lateral direction. Similarly to a surface-emitting light source 300 shown in FIG. 11 described later, a surface-emitting light source 500 shown in FIG. 9C conforms to a screen size of, for example, 15.6 inches. As shown in FIG. 9D, the surface-emitting light source 500 includes a region (hereinafter also referred to as a main body region) in which a plurality of light-emitting elements 121 are two-dimensionally arranged and four projecting regions projecting in the same direction from a side of the rectangular shape of the main body region. Each projecting region is provided with a relay terminal 510 formed by integration of wiring connected to a plurality of light-emitting elements 121. The relay terminal 510 is connected to a power source or the like, and a current is supplied from the external power source to the light-emitting elements 121 via the relay terminal 510 and the wiring layer 180.

A boundary portion between the main body region and the projecting region of the surface-emitting light source 500 can include a step portion. The step portion in the boundary portion between the main body region and the projecting region can inhibit excessive misalignment of the surface-emitting light source when the surface-emitting light source is installed into another member such as a casing. The number of the relay terminals 510 can be changed as appropriate in accordance with the number of light-emitting elements 121 or the number of groups of light-emitting modules in the main body region of the surface-emitting light source.

Figure 10:
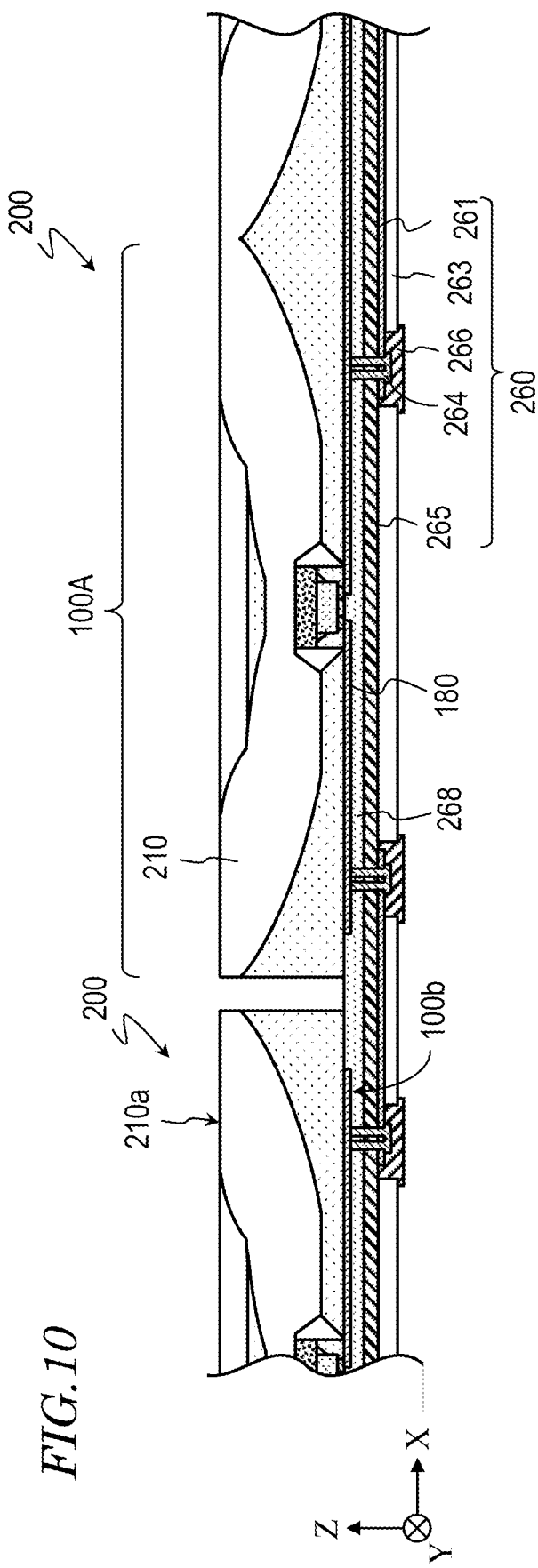
FIG. 10 is a schematic cross-sectional view of surface-emitting light sources connected to a wiring board.

FIG. 10 schematically shows an example in which the surface-emitting light source(s) 200 is connected to a wiring board. A light-emitting device in the present disclosure can include a wiring board 260 as shown in FIG. 10. The wiring board 260 is located at the lower surface side of the surface-emitting light source 200, or the surface opposite to the upper surface 210a of the light-guiding plate 210, and is connected to the wiring layer 180 of the light-emitting module 100A.

In the illustrative structure shown in FIG. 10, the wiring board 260 includes an insulating base member 265, a wiring layer 261 on the insulating base member 265, a covering layer 263, and protective members 266, and provided with a plurality of vias 264. The wiring layer 261 is located on one of the main surfaces of the insulating base member 265 opposite to the light-emitting module 100A. The covering layer 263 with a predetermined thickness covers at least part of the wiring layer 261, and has a function of protecting the wiring layer 261.

As shown in FIG. 10, a third bonding member 268 formed of resin or the like is disposed between the light-emitting module 100A and the wiring board 260 to fix the light-emitting module 100A to the wiring board 260. As schematically shown in FIG. 10, each of the vias 264 passes through the insulating base member 265 to electrically connect the wiring layer 261 described above to the wiring layer 180 of the light-emitting module 100A. The protective members 266 corresponding to the vias 264 are disposed on the main surface of the insulating base member 265 opposite to the light-emitting module 100A to protect the vias 264 and portions of the wiring layer 261 around the vias 264.

For example, a driver for driving the surface-emitting light source 200 on the wiring board 260 is connected to the wiring layer 261 of the wiring board 260. Accordingly, electrical connection between a plurality of light-emitting elements 121 and the driver is established through the wiring layer 261 and the vias 264 of the wiring board 260. The wiring layer 180 connected to each light-emitting element 121 can be provided at the surface-emitting light source 200 side in the present embodiment, so that connection required for local dimming or the like can be easily established without forming a complicated wiring pattern on the wiring board 260. The wiring layer 180 can have an area greater than the areas of the lower surfaces of the electrodes 124 of each light-emitting element 121, and electrical connection with the wiring board 260 is therefore comparatively easily established. In the case in which the light-emitting module 100 does not include the wiring layer 180, the vias 264 of the wiring board 260 can be connected to the electrodes 124 of the light-emitting elements 121.

Wiring is provided on the surface-emitting light source 200 including a plurality of light-emitting elements 121 by disposing the wiring layer 180 at the lower surface 100b side of the light-emitting module 100A as described above. This can eliminate the need for electrical connection between each light-emitting element 121 and the wiring board 260. In other words, establishment of connection between the surface-emitting light source 200 or the light-emitting module 100A and a power source or the like is facilitated. That is, surface emission is easily obtained in a manner in which the wiring board 260 connected to the power source or the like is connected to the surface-emitting light source 200. In particular, a plurality of surface-emitting light sources 200 can be combined to configure a larger surface-emitting light source as described below, and local dimming of the large surface-emitting light source can be performed by driving a plurality of light-emitting elements 121 in units of, for example, the surface-emitting light sources 200. A wiring pattern that allows the light-emitting elements 121 to be driven in units of one or more light-emitting modules 100A can be employed for the wiring layer 180.

Figure 11:
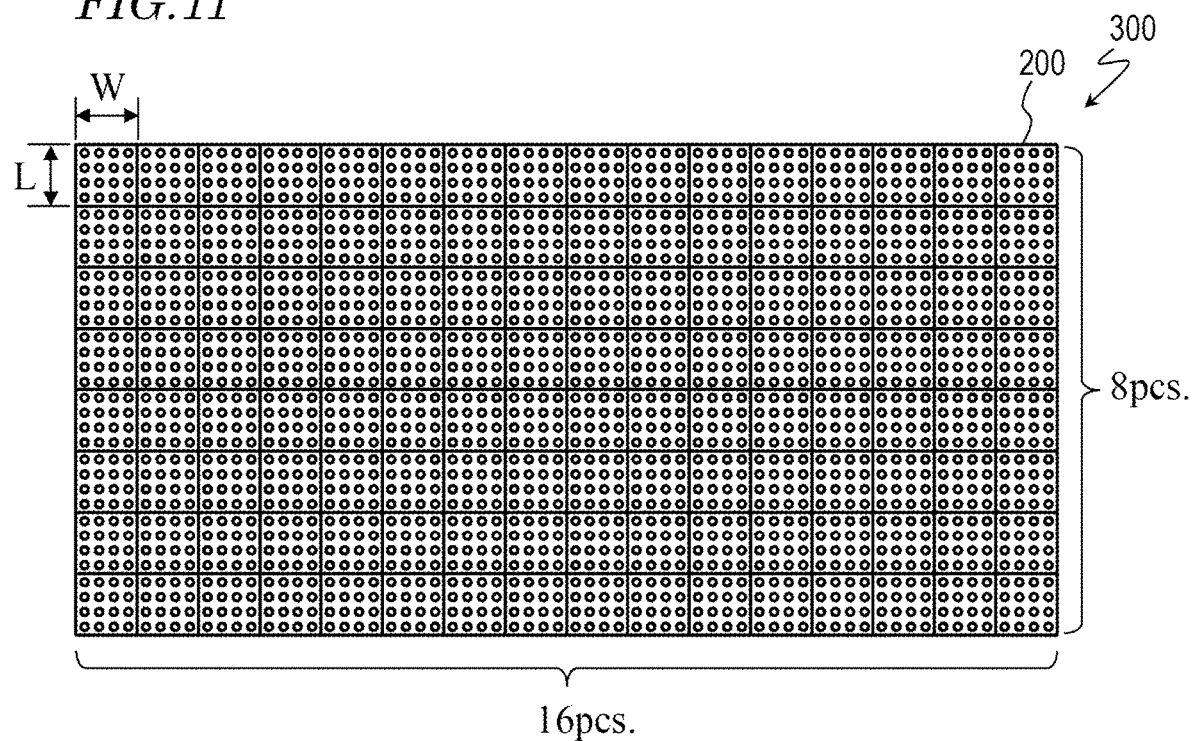
FIG. 11 is a schematic plan view of an example in which a plurality of surface-emitting light sources each shown in FIG. 1 are two-dimensionally arranged.

FIG. 11 schematically shows an example in which a plurality of surface-emitting light sources 200 are two-dimensionally arranged. A light-emitting surface with a larger area is obtained by two-dimensionally arranging a plurality of surface-emitting light sources 200.

The surface-emitting light source 300 shown in FIG. 11 includes a plurality of surface-emitting light sources 200 each shown in FIG. 1. FIG. 11 schematically shows the appearance of the two-dimensional array of the surface-emitting light sources 200 arranged in an 8-by-16 matrix when viewed from the upper surface 210a side of the light-guiding plate 210 (i.e., in a top view). The upper surface 210a of each light-guiding plate 210 has a rectangular shape when viewed in the normal direction to the upper surface 210a of the light-guiding plate 210, and the set of the upper surfaces 210a of the light-guiding plates 210 serving as the light-emitting surface of the surface-emitting light source 300 also has a rectangular shape as a whole. The surface-emitting light source 300 can further include optical sheets such as a diffusion sheet and a prism sheet over the light-guiding plate 210.

The light-guiding plates 210 of two surface-emitting light sources 200 adjacent to each other in the row or column direction are typically in direct contact with each other. However, it is not required that the light-guiding plates 210 of two adjacent surface-emitting light sources 200 are in direct contact with each other in the two-dimensional array. A light-guiding member that optically couples two adjacent light-guiding plates 210 may be disposed between the light-guiding plates 210. Such a light-guiding member can be formed by, for example, applying a light-transmissive adhesive to the lateral surfaces of the light-guiding plates 210 and hardening the applied adhesive. Alternatively, a plurality of surface-emitting light sources 200 can be two-dimensionally arranged such that the surface-emitting light sources 200 are spaced from each other, a light-transmissive resin material can be applied to the region between two adjacent light-guiding plates 210, and the resin material can be cured to form the light-guiding member. The same or a similar material as the material of the bonding member 160 described above can be used as the material of the light-guiding member located between the light-guiding plates 210. It is beneficial that a material with a refractive index equal to or higher than the refractive index of the material of the light-guiding plates 210 can be used as the base material of the light-guiding member. A light-diffusing function can be imparted to the light-guiding member between the light-guiding plates 210.

For example, in the case in which a length L in the length direction and a length W in the width direction of each surface-emitting light source 200 are about 24.3 mm and 21.5 mm, respectively, the arrangement of the surface-emitting light sources 200 shown in FIG. 11 conforms to a screen size of 15.6 inches with an aspect ratio of 16:10. For example, the surface-emitting light source 300 shown in FIG. 11 can be suitably used for a backlight unit of a laptop with a screen size of 15.6 inches.

In this example, the set of the upper surfaces 210a of the light-guiding plates 210, which are the upper surfaces of the respective surface-emitting light sources 200, constitutes the light-emitting surface. Hence, changing the number of surface-emitting light sources 200 included in the surface-emitting light source 300 or changing the arrangement of the surface-emitting light sources 200 allows the surface-emitting light source 300 to be easily applied to a plurality of types of LCD panels with different screen sizes. That is, changes in the screen size may be flexibly accepted without the need for redoing optical calculation for the light-guiding plates 210 in the surface-emitting light sources 200 or the like or reproducing a mold for the light-guiding plates 210. Hence, increase of the manufacturing costs or the lead time due to changes in the screen size may be avoided.

Figure 12:
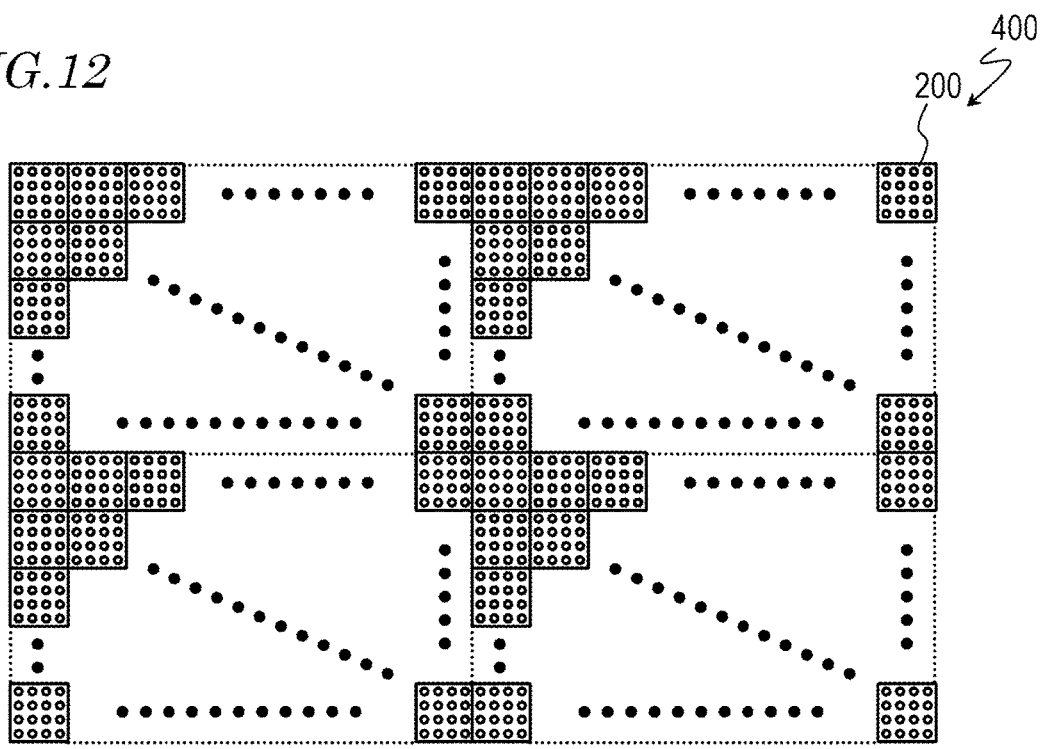
FIG. 12 is a schematic plan view of a structure in which sets of a plurality of surface-emitting light sources each shown in FIG. 11 are arranged in a two-by-two matrix.

FIG. 12 schematically shows a structure in which sets of a plurality of surface-emitting light sources 200 each shown in FIG. 11 are arranged in a two-by-two matrix. In this case, a total of 512 surface-emitting light sources 200 can constitute a surface-emitting light source 400 conforming to a screen size of 31.2 inches with an aspect ratio of 16:10. For example, the arrangement of the surface-emitting light sources 200 shown in FIG. 12 can be used for a backlight unit of an LCD TV. As described above, with the present embodiment, a light-emitting surface with an even larger area can be comparatively easily obtained.

A technique of combining a plurality of surface-emitting light sources 200 to constitute a light-emitting surface with a larger area may provide flexibility to conform to LCD panels of various screen sizes without redesigning the optical system according to the screen size or reproducing a mold for the light-guiding plates. That is, a backlight unit conforming to a given screen size may be provided at low cost with short delivery times. Even if an unlit light-emitting element occur due to disconnection or the like, there is an advantage that the defect can be solved by replacing the surface-emitting light source containing the defective light-emitting element.

As described above, with the embodiment in the present disclosure, light emitted from the light-emitting element 121 can be diffused in the plane of the light-guiding plate 110A while reflection of light at the light-reflective layer 130 inhibits the luminance directly above the light-emitting element 121 from increasing excessively. Further, the first opening 11a of the first portion 11A, which is closer to the light-emitting element 121, of the first hole 10A has an oval shape, so that the luminance in portions close to the long sides of the rectangular shape of the light-guiding plate 110A can be inhibited from being relatively high. Accordingly, uniform light can be produced by a slim device. Furthermore, as in the example described referring to FIG. 3, the wavelength conversion member 150 disposed between the light-emitting element 121 and the light-guiding plate 110A can allow light having mixed color to be diffused in the plane of the light-guiding plate 110A before the light is emitted from the upper surface 110a of the light-guiding plate 110A.

With the embodiment in the present disclosure, for example, the thickness of the structure including the light-reflective member 140, in other words, the distance from the lower surfaces of the electrodes 124 of the light-emitting element 121 to the upper surface 110a of the light-guiding plate 110A, can be reduced to, for example, 5 mm or less, 3 mm or less, or 1 mm or less. The distance from the lower surfaces of the electrodes 124 of the light-emitting element 121 to the upper surface 110a of the light-guiding plate 110A can be about 0.7 mm or more and 1.1 mm or less.

Figure 13:
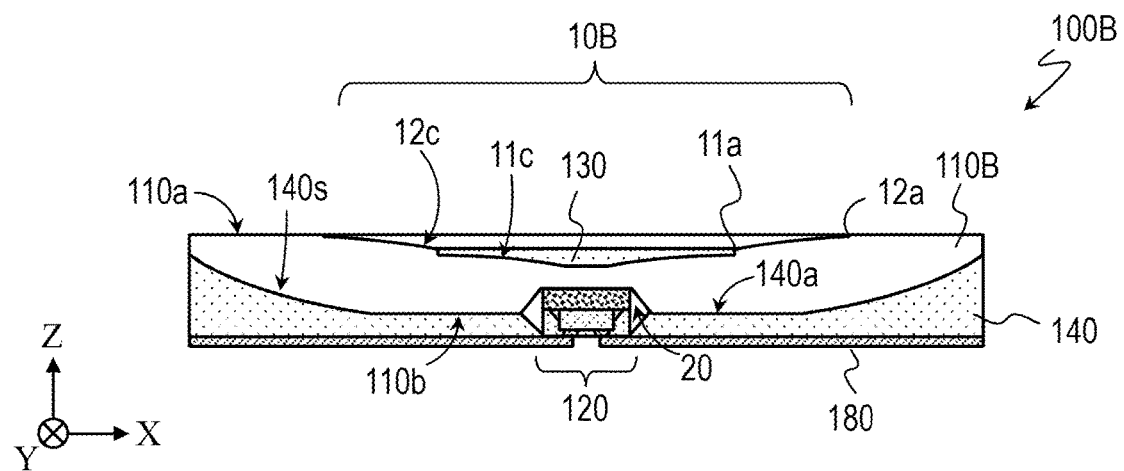
FIG. 13 schematically shows a cross section of a light-emitting module according to another embodiment in the present disclosure.

FIG. 13 schematically shows a cross section of a light-emitting module according to another embodiment in the present disclosure. A light-emitting module 100B shown in FIG. 13 is another example of the light-emitting module 100 shown in FIG. 1. The light-emitting module 100B differs from the light-emitting module 100A described referring to FIG. 2 in that the light-emitting module 100B includes a light-guiding plate 110B instead of the light-guiding plate 110A. A first hole 10B is formed at the upper surface 110a of the light-guiding plate 110B as shown in FIG. 13. Similarly to the examples described above, the light-reflective layer 130 is located inside the first hole 10B.

Figure 14:
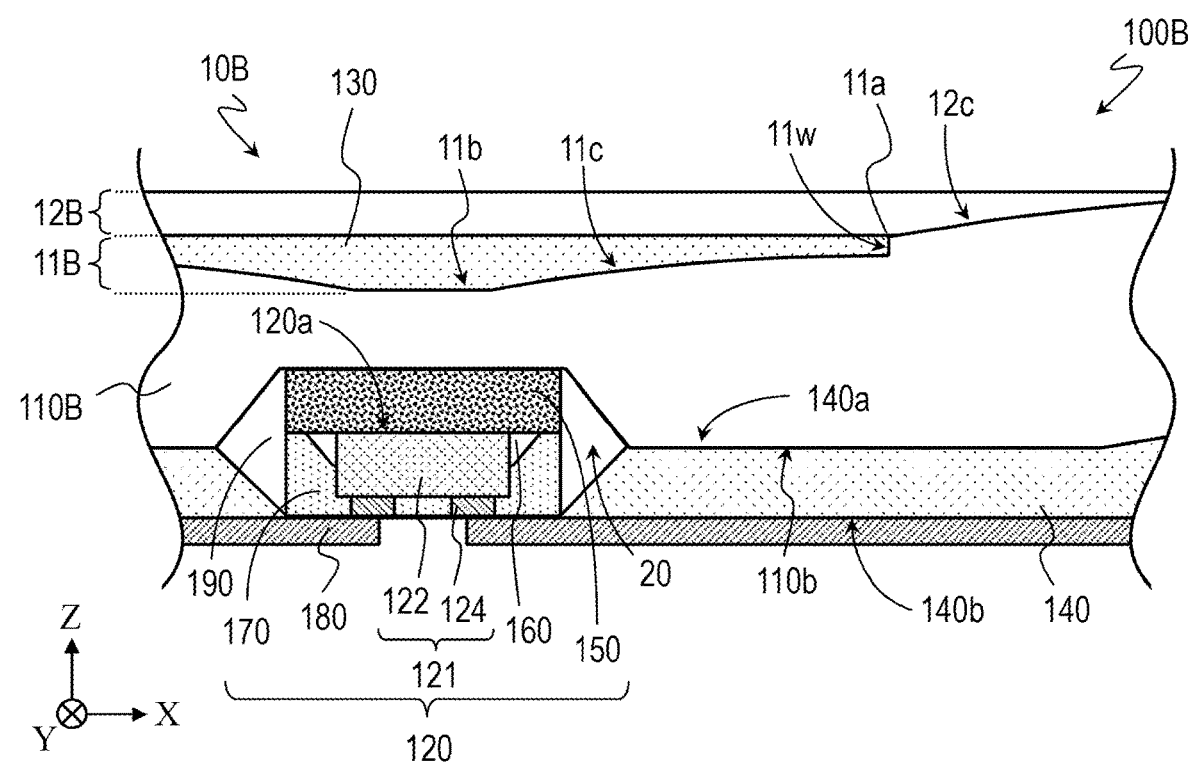
FIG. 14 is a schematic enlarged view of a light-emitting body and its vicinity in FIG. 13.

FIG. 14 is a schematic enlarged view of the light-emitting body 120 and its vicinity in FIG. 13. In the illustrative structure shown in FIG. 14, the first hole 10B includes a first portion 11B and a second portion 12B that is located closer to the upper surface 110a than the first portion 11A is and has the second opening 12a located at the upper surface 110a of the light-guiding plate 110B. The light-reflective layer 130 is located inside the first portion 11B in the first hole 10B.

The first portion 11B of the first hole 10B has the bottom surface 11b, the first lateral surface 11c, and the first opening 11a located at the boundary between the first portion 11B and the second portion 12B. As shown in FIG. 14, the first portion 11B further has an inner wall surface 11w located between the first lateral surface 11c and the first opening 11a. The inner wall surface 11w is substantially perpendicular to the upper surface 110a of the light-guiding plate 110B. As shown in the drawings, in this example, the light-reflective layer 130 occupies a space from the bottom surface 11b to the first opening 11a of the first portion 11B in the first hole 10B and has a shape in which an substantially cylindrical columnar portion and an substantially inverted truncated conical portion are coupled to each other.

For example, the inner wall surface 11w of the first portion 11B has a height of about 50 µm along the Z direction in the drawings. The inner wall surface 11w formed between the first lateral surface 11c and the first opening 11a of the first portion 11B as shown in FIG. 14 can inhibit the material of the light-reflective layer 130 from spreading over the second lateral surface 12c of the second portion 12B beyond the first opening 11a when the light-reflective layer 130 is formed. In other words, the inner wall surface 11w of the first portion 11B enables the shape of the outer edge of the light-reflective layer 130 to be delimited at the position of the inner wall surface 11w. Hence, luminance non-uniformity due to part of the material of the light-reflective layer 130 irregularly remaining on the second lateral surface 12c of the second portion 12B can be avoided. Further, this can inhibit reduction in the volume of a layer such as an air layer inside the second portion 12B due to penetration of part of the material of the light-reflective layer 130 into the second portion 12B. For ease of molding using a mold or the like, the inner wall surface 11w can be inclined at an angle of about 5° with respect to the normal to the upper surface 110a of the light-guiding plate 110B so that the first portion 11B has such a shape that broadens from the lower surface 110b toward the upper surface 110a of the light-guiding plate 110B.

The appearance of the light-emitting module 100B shown in FIG. 13 and FIG. 14 when viewed from the upper surface 110a of the light-guiding plate 110B can be substantially the same as the appearance of the light-emitting module 100A shown in the lower part of FIG. 2 or FIG. 4. That is, the first opening 11a of the first portion 11B has an oval shape in a plan view. The second opening 12a of the first portion 11B can also have an oval shape or the shape of a perfect circle in a plan view. A first major axis defining the oval shape of the first opening 11a is parallel to the short sides of the rectangular shape of the light-guiding plate 110B, and a second major axis defining the oval shape of the second opening 12a is orthogonal to the first major axis. The boundary between the first lateral surface 11c and the inner wall surface 11w has an oval shape when the first portion 11B is viewed from the upper surface 110a of the light-guiding plate 110B (i.e., in a top view). The relation between the two symmetry axes defining the oval shape of the boundary between the first lateral surface 11c and the inner wall surface 11w in terms of lengths is the same as the relation between the two symmetry axes defining the oval shape of the first opening 11a in terms of lengths. That is, longer one of the two symmetry axes defining the oval shape of the boundary between the first lateral surface 11c and the inner wall surface 11w is parallel to the short sides of the rectangular shape of the light-guiding plate 110B.

According to the investigation by the present inventors, when the thickness of the light-guiding plate in the light-emitting module is reduced, increase in luminance near the centers of the long sides of the rectangular shape becomes remarkable. The first hole, particularly the first opening 11a, formed on the upper surface 110a side of the light-guiding plate has an oval shape in a top view in the embodiment in the present disclosure, so that increase in luminance near the centers of the long sides of the rectangular shape due to reduction in the thickness of the light-guiding plate can be inhibited. The luminance in the region directly above the light-emitting element 121 is likely to increase as the thickness of the light-guiding plate decreases, but excessive increase in the luminance in the region directly above the light-emitting element 121 due to reduction in the thickness of the light-guiding plate can be avoided by increasing the amount of the light-reflective filler to be dispersed in the base material of the light-reflective layer 130. The depth of the first portion 11B, in other words, the distance from the bottom surface 11b to the first opening 11a along the Z direction in the drawing can be in the range of, for example, 100 µm or more and 150 µm or less in this example. The first portion 11B having the inner wall surface 11w can increase the volume of the light-reflective layer 130 inside the first portion 11B. This may avoid excessive increase in the luminance in the region directly above the light-emitting element 121.

Figure 15:
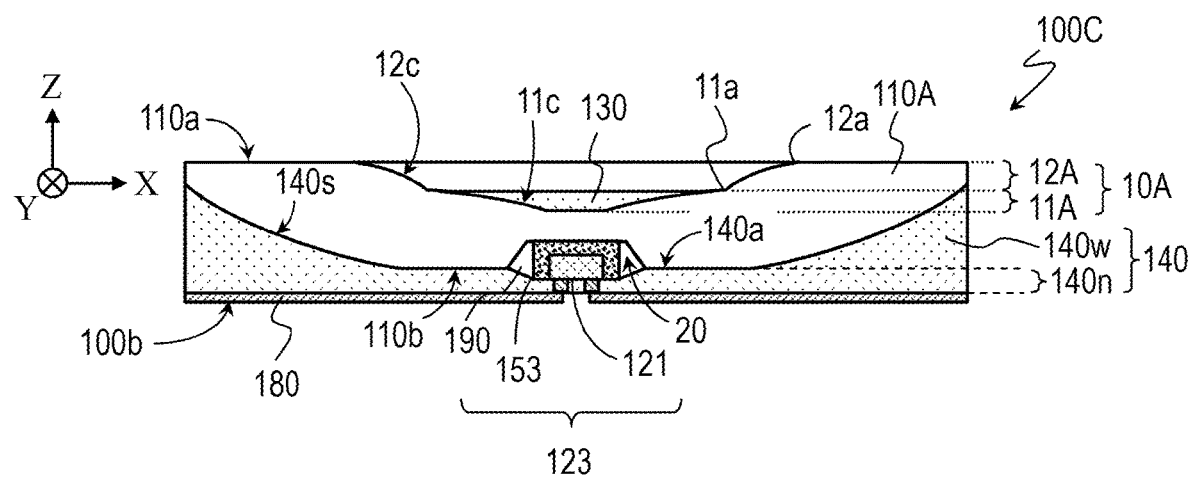
FIG. 15 schematically shows a cross section of a light-emitting module according to still another embodiment in the present disclosure.

FIG. 15 schematically shows a cross section of a light-emitting module according to still another embodiment in the present disclosure. A light-emitting module 100C shown in FIG. 15 is still another example of the light-emitting module 100 shown in FIG. 1 and includes the light-guiding plate 110A and a light-emitting body 123 disposed inside the second hole 20 of the light-guiding plate 110A. The light-emitting body 123 is fixed to the bottom of the second hole 20 of the light-guiding plate 110A using the bonding member 190.

The light-emitting body 123 includes the light-emitting element 121 and a wavelength conversion member 153. As schematically shown in FIG. 15, the wavelength conversion member 153 covers not only the upper surface 120a of the light-emitting element 121 but also the lateral surfaces of the element body 122. The shape of the wavelength conversion member is not limited to a plate shape as described above, but can be such a shape as to cover the lateral surfaces in addition to the upper surface 120a of the light-emitting element 121. Such a structure allows light emitted from the lateral surfaces of the light-emitting element 120 and subjected to wavelength conversion to efficiently enter the light-guiding plate 110A.

In this example, the light-reflective member 140 also covers portions of the wavelength conversion member 153 and portions of the light-emitting element 121 opposite to the upper surface 110a of the light-guiding plate 110A. The lower surfaces of the electrodes 124 of the light-emitting element 121 are exposed from the lower surface 140b of the light-reflective member 140 below the lower surface 100b of the light-emitting module 100C. By covering the lower surface of the light-emitting body 123 with the light-reflective member 140 except for the lower surfaces of the electrodes 124 of the light-emitting element 121, leakage of light toward the lower surface 100b of the light-emitting module 100C is inhibited, so that reduction in light extraction efficiency can be avoided. Needless to say, the light-guiding plate 110B can be applied instead of the light-guiding plate 110A.

Figure 16:
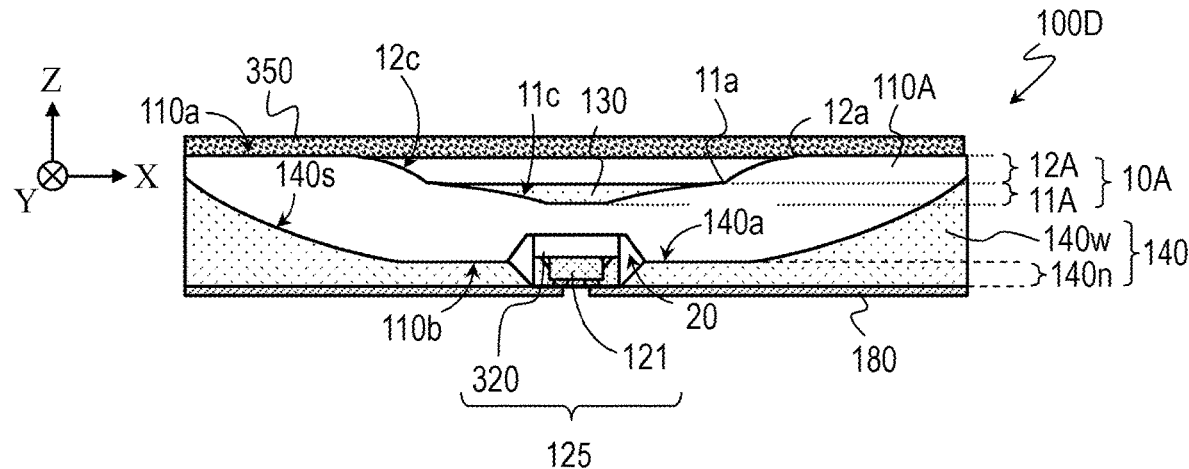
FIG. 16 schematically shows a cross section of a light-emitting module according to still another embodiment in the present disclosure.

FIG. 16 schematically shows a cross section of a light-emitting module according to still another embodiment in the present disclosure. A light-emitting module 100D shown in FIG. 16 is also an example of the light-emitting module 100 constituting the surface-emitting light source 200 described above.

The light-emitting module 100D shown in FIG. 16 includes the light-guiding plate 110A, a light-emitting body 125 containing the light-emitting element 121 as a part, and a wavelength conversion sheet 350. In the illustrative structure shown in FIG. 16, the wavelength conversion sheet 350 is located on the upper surface 110a of the light-guiding plate 110A. The wavelength conversion sheet 350 can be in contact with the upper surface 110a of the light-guiding plate 110A, or can be disposed above the light-guiding plate 110A away from the upper surface 110a of the light-guiding plate 110A. In the case in which optical sheets such as a diffusion sheet and a prism sheet are also disposed over the light-guiding plate 110A, it is advantageous that the diffusion sheet, the wavelength conversion sheet 350, and the prism sheet be disposed over the light-guiding plate 110A in this order from the upper surface 110a in view of reduction in luminance non-uniformity. That is, it is beneficial that the diffusion sheet be located between the upper surface 100a of the light-guiding plate 110A and the wavelength conversion sheet 350, and that the wavelength conversion sheet 350 be disposed between the diffusion sheet and the prism sheet.

The wavelength conversion sheet 350 is typically a resin sheet in which phosphor particles are dispersed. Use of such a wavelength conversion sheet 350 allows the phosphor to be uniformly positioned over the light-guiding plate 110A. The light-guiding plate 110B can be applied instead of the light-guiding plate 110A. Substantially the same effect can be obtained also in this case. The same or similar materials as the materials used for forming the wavelength conversion members 150 and 153 can be used as the material of the wavelength conversion sheet 350.

The light-emitting body 125 differs from the light-emitting body 120 described above in that the light-emitting body 125 includes a plate-shaped light-transmissive member 320 instead of the wavelength conversion member 150. That is, the light-emitting body 125 includes the light-emitting element 121, the light-transmissive member 320, the bonding member 160, and the light-reflective member 170.

The light-transmissive member 320 is formed of a light-transmissive material. As the material of the light-transmissive member 320, a silicone resin, a modified silicone resin, an epoxy resin, a modified epoxy resin, a urea resin, a phenolic resin, an acrylic resin, a urethane resin, a fluorine resin, or a resin containing two or more of these resins can be used. A function of diffusing light can be imparted to the light-transmissive member 320 by dispersing a material with a refractive index different from the refractive index of the base material into the material of the light-transmissive member 320. For example, particles of titanium dioxide or silicon oxide can be dispersed into the base material of the light-transmissive member 320.

Figure 17:
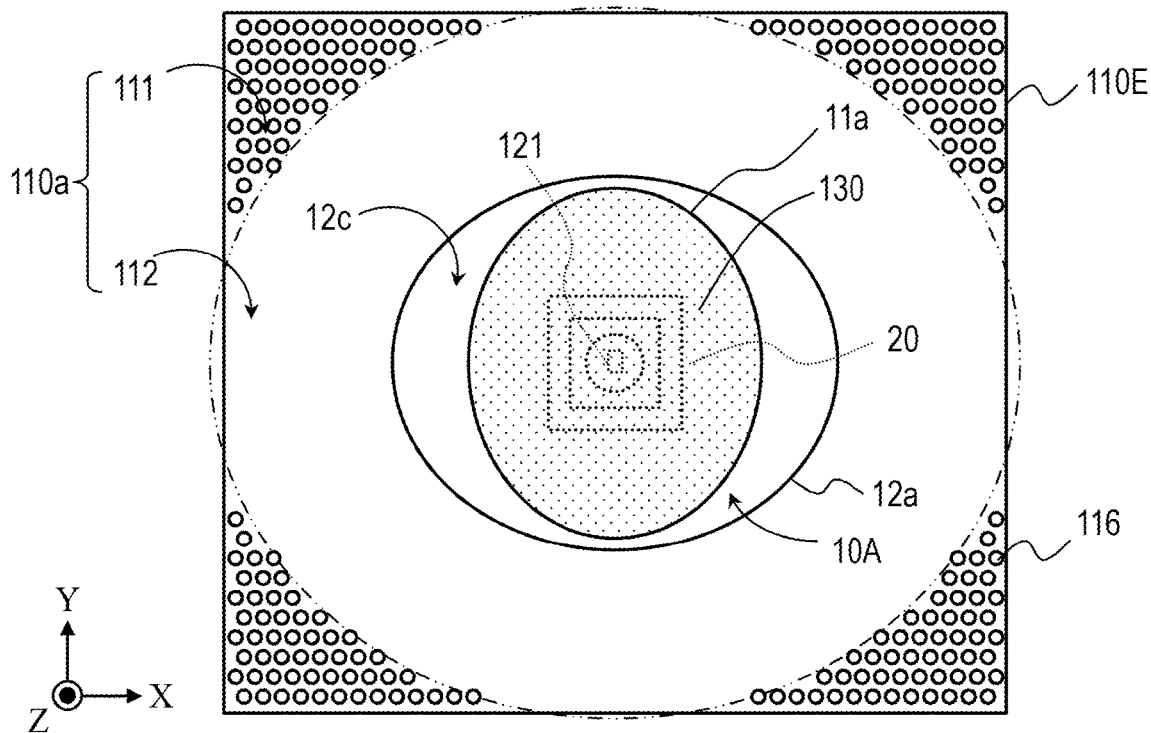
FIG. 17 is a schematic plan view of an illustrative appearance of a light-emitting module according to still another embodiment in the present disclosure.

FIG. 17 schematically shows the appearance of a light-emitting module according to still another embodiment in the present disclosure when viewed from the upper surface. A light-emitting module 100E can also be applied to the light-emitting module 100 constituting the surface-emitting light source 200. The light-emitting module 100E differs from the light-emitting module 100A described referring to FIG. 3 in that the light-emitting module 100E includes a light-guiding plate 110E instead of the light-guiding plate 110A.

As schematically shown in FIG. 17, the upper surface 110a of the light-guiding plate 110E of the light-emitting module 100E has a plurality of projections 116 in the form of dots. The upper surface 110a of the light-guiding plate 110E includes a first region 111 that does not overlap with the first hole 10A of the upper surface 110a in a top view and a second region 112 located inside the first region 111 in a top view. In this example, the first region 111 surrounds the second region 112, and the projections 116 are selectively located in the first region 111 of the upper surface 110a of the light-guiding plate 110E.

Light emitted from the light-emitting element 121 and introduced into the light-guiding plate 110E from the lower surface 110b side of the light-guiding plate 110E can be efficiently extracted from the first region 111 by, for example, disposing a plurality of projections 116 in a region not overlapping with the first hole (serving as a light-diffusing body) on the upper surface 110a of the light-guiding plate 110E. That is, the luminance in the first region 111 when viewed in the normal direction to the upper surface 110a of the light-guiding plate 110E can be relatively enhanced. In this example, a plurality of projections 116 are arranged in the four corners and their vicinities of the rectangular shape of the light-guiding plate 110E. The four corners and their vicinities are likely to be relatively dark in the upper surface 110a of the light-guiding plate 110E. Hence, the luminance in the four corners and their vicinities of the rectangular shape of the light-guiding plate 110E can be enhanced, so that the effect of further reducing luminance non-uniformity is obtained.

In the illustrative structure shown in FIG. 17, each of the projections 116 has a circular shape in a plan view, and is projecting from the upper surface 110a. The diameter of the circular shape of the projection 116 is in the range of, for example, 1 μm or more and 500 μm or less. The shape of each projection 116 is not limited to a circular shape but can be another shape such as an elliptic shape, a polygonal shape, or an indefinite shape. In FIG. 17, the projections 116 are exaggerated in size to facilitate understanding.

The YZ cross section or ZX cross section of each projection 116 in the drawing typically has a semicircular shape, but it is sufficient that the projection 116 has a shape projecting from the upper surface 110a of the light-guiding plate 110E because such a shape can have an effect of increasing light to be extracted from the upper surface 110a by reducing total reflection within the light-guiding plate 110E. The projection 116 can have any of various shapes such as a hemispherical shape, a conical shape, a polygonal pyramid shape, and a frustum shape according to desired optical properties. Alternatively, annular projections can be arranged on the upper surface 110a of the light-guiding plate 110E instead of the projections in the form of dots. The projections 116 are arranged in the first region 111 such that their centers are located at lattice points of a triangular lattice in the example shown in FIG. 17, but the arrangement of a plurality of projections 116 is not limited to this example. Any arrangements can be employed for the projections 116 according to desired optical properties. For example, a plurality of projections 116 can be two-dimensionally arranged in the first region 111 such that their centers are located at lattice points of a square lattice.

In this example, a plurality of projections 116 are arranged in the first region 111 of the upper surface 110a of the light-guiding plate 110E at a substantially uniform number density. It is not required in the embodiment in the present disclosure that the number density of a plurality of projections 116 be uniform. If the number density of a plurality of projections 116 increases with increasing distance from the light-emitting element 121, the proportion of the projections 116 per unit area can concentrically increase with the light-emitting element 121 being the center. Accordingly, the luminance in a region farther from the light-emitting element 121 increases, and the effect of reducing luminance non-uniformity can be obtained. The expression "number density of a plurality of projections" as used herein refers to the number of projections per unit area on the upper surface of the light-guiding plate. The "concentric circles" in the present specification are interpreted so that not only a set of a plurality of perfect circles sharing a center but also a set of a plurality of oval shapes (such as ellipses) having intersection points of symmetry axes, which are orthogonal to each other, corresponding to one another is included.

A plurality of projections 116 can be formed on the upper surface 110a of the light-guiding plate 110E such that the number density increases with increasing distance from the light-emitting element 121. For example, a plurality of projections 116 can be arranged on the upper surface 110a of the light-guiding plate 110E such that the arrangement pitch decreases with increasing distance from the light-emitting element 121. The expression "arrangement pitch of a plurality of projections" as used herein refers to the minimum one of distances between the centers of two adjacent projections. The arrangement pitch of a plurality of projections 116 can be appropriately selected according to the dimensions and shape of each projection 116 and optical properties to be obtained. The arrangement pitch of a plurality of projections 116 is in the range of, for example, 10 μm or more and 200 μm or less.

Alternatively, the size of a plurality of projections 116 can increase with increasing distance from the light-emitting element 121. Such a structure can also increase the number density of a plurality of projections 116 with increasing distance from the light-emitting element 121. In the case in which an annular shape is employed for the shape of each projection 116 instead of a dot, the number density of a plurality of projections 116 can be increased with increasing distance from the light-emitting element 121 by reducing the interval between two adjacent annular projections with increasing distance from the light-emitting element 121 or by increasing the widths of the annular projections with increasing distance from the light-emitting element 121.

In this example, a plurality of projections 116 are arranged in a region of the upper surface 110a of the light-guiding plate 110E except for the second region 112 and a region in which the first hole 10A is formed. In other words, the second region 112 of the light-guiding plate 110E is a flat surface in this case. As indicated by the double dot dash line in FIG. 17, the second region 112 is a substantially elliptic region centered on the position of the light-emitting element 121 in this example. A plurality of projections 116 can be formed not only in the first region 111 but also in the second region 112. In this case, the number densities of a plurality of projections 116 can be different between the first region 111 and the second region 112.

Instead of the projections 116, a plurality of recesses having dot shapes can be formed in the upper surface 110a of the light-guiding plate. The term "dot" as used in the present specification generally refers to a structure having a round shape represented as a circle or an ellipse in a plan view. The term "dot" as used in the present specification can be interpreted so as to implicate both of a shape projecting from the upper surface 110a of the light-guiding plate and a shape recessed below the upper surface 110a. Alternatively, a plurality of annular recesses (that can be called a plurality of grooves) can be formed at the upper surface 110a of the light-guiding plate. Even in the case in which a plurality of recesses are formed at the upper surface 110a of the light-guiding plate instead of the projections 116, substantially the same effect of reducing luminance non-uniformity as in the case in which a plurality of projections 116 are formed on the upper surface 110a of the light-guiding plate can be obtained. A plurality of projections and a plurality of recesses can be formed on the upper surface 110a of the light-guiding plate in a mixed manner. Employing the projections increases the thickness of the light-guiding plate by the height of the projections because the projections protrude from the upper surface 110a of the light-guiding plate, but the projecting shape is easy to form in the case in which a mold or the like is used to manufacture the light-guiding plate.

The number density and the arrangement pitch of a plurality of recesses can be defined in substantially the same manner as for the number density and the arrangement pitch of a plurality of projections. The number density of a plurality of recesses can be defined as the number of recesses per unit area in the upper surface of the light-guiding plate, and the arrangement pitch of a plurality of recesses can be defined as the minimum one of distances between the centers of two adjacent recesses.

EXAMPLES

Optical calculation was performed on the assumption that a plurality of samples with different constitutions of light-guiding plates were used, and luminance non-uniformity on the upper surface of the light-guiding plate was evaluated for each sample.

It was assumed that a sample of an example was a surface-emitting light source including a four-by-four array of a plurality of light-emitting modules each having substantially the same structure as the light-emitting module 100B shown in FIG. 13 and FIG. 14, and optical calculation was performed. The aspect ratio of the rectangular shape of the light-guiding plate was 16:10. It was assumed that the first opening of the first portion and the second opening of the second portion of the first hole both had an oval shape in a plan view.

It was assumed that a sample of a reference example was a surface-emitting light source including a four-by-four array of light-emitting modules in each of which the shapes of the first opening of the first portion and the second opening of the second portion of the first hole were perfect circles sharing a center, and optical calculation was performed. Similarly to the sample of the example, the lower surface of the light-guiding plate of each light-emitting module in the surface-emitting light source of the reference example includes a flat region and an inclined region. Calculation was performed on the assumption that the boundary between the flat region and the inclined region did not have an elliptic shape but had a rectangular shape in a top view. The aspect ratio of the rectangular shape of the light-guiding plate in the sample of the reference example was 16:9, and the light-guiding plate in the sample of the reference example was 150 μm thicker than the thickness of the light-guiding plate in the sample of the example.

Figure 18:
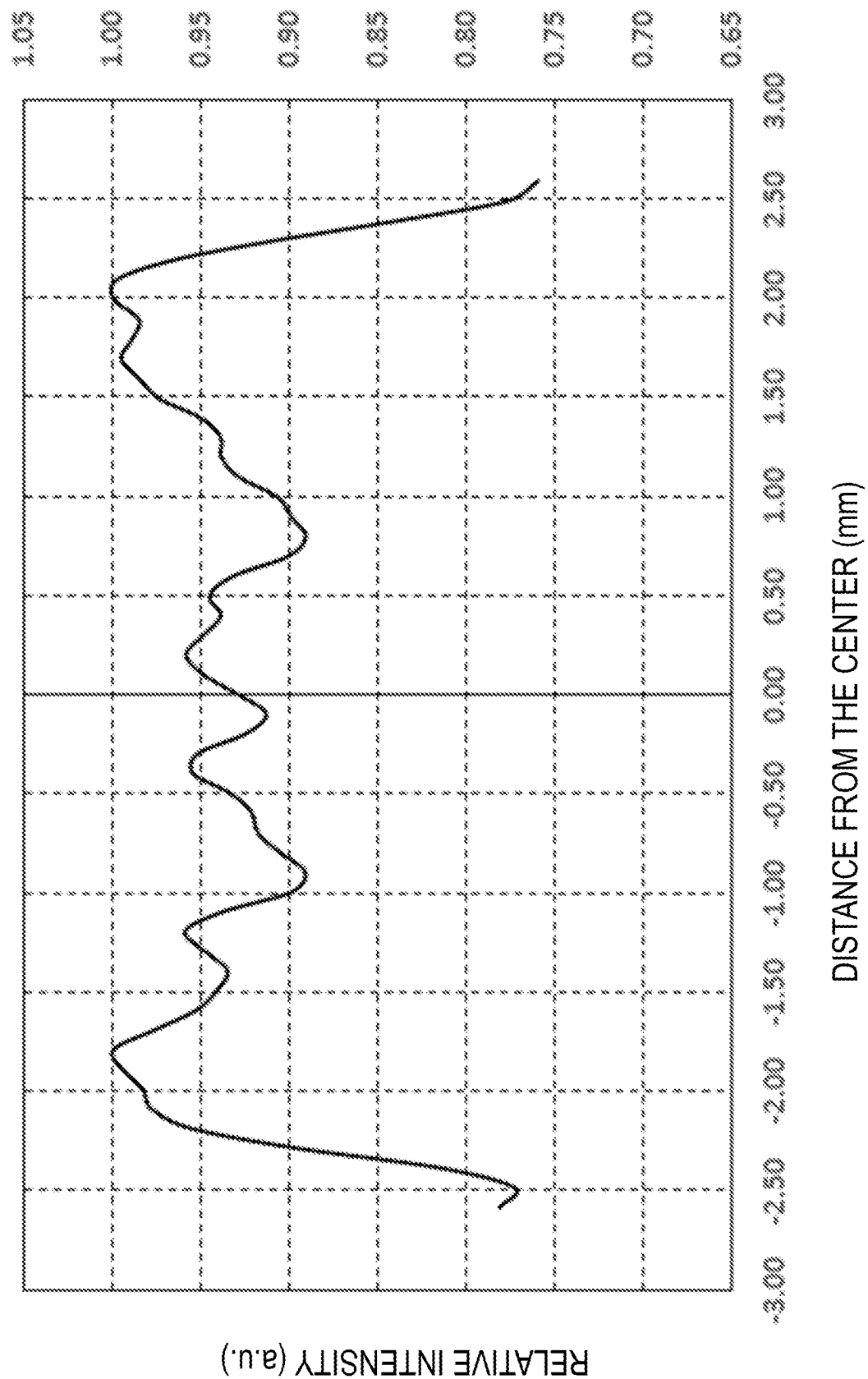
FIG. 18 schematically shows simulation results of a luminance profile on the assumption that a prism sheet is additionally disposed over a light-guiding plate of a sample of an example.
Figure 19:
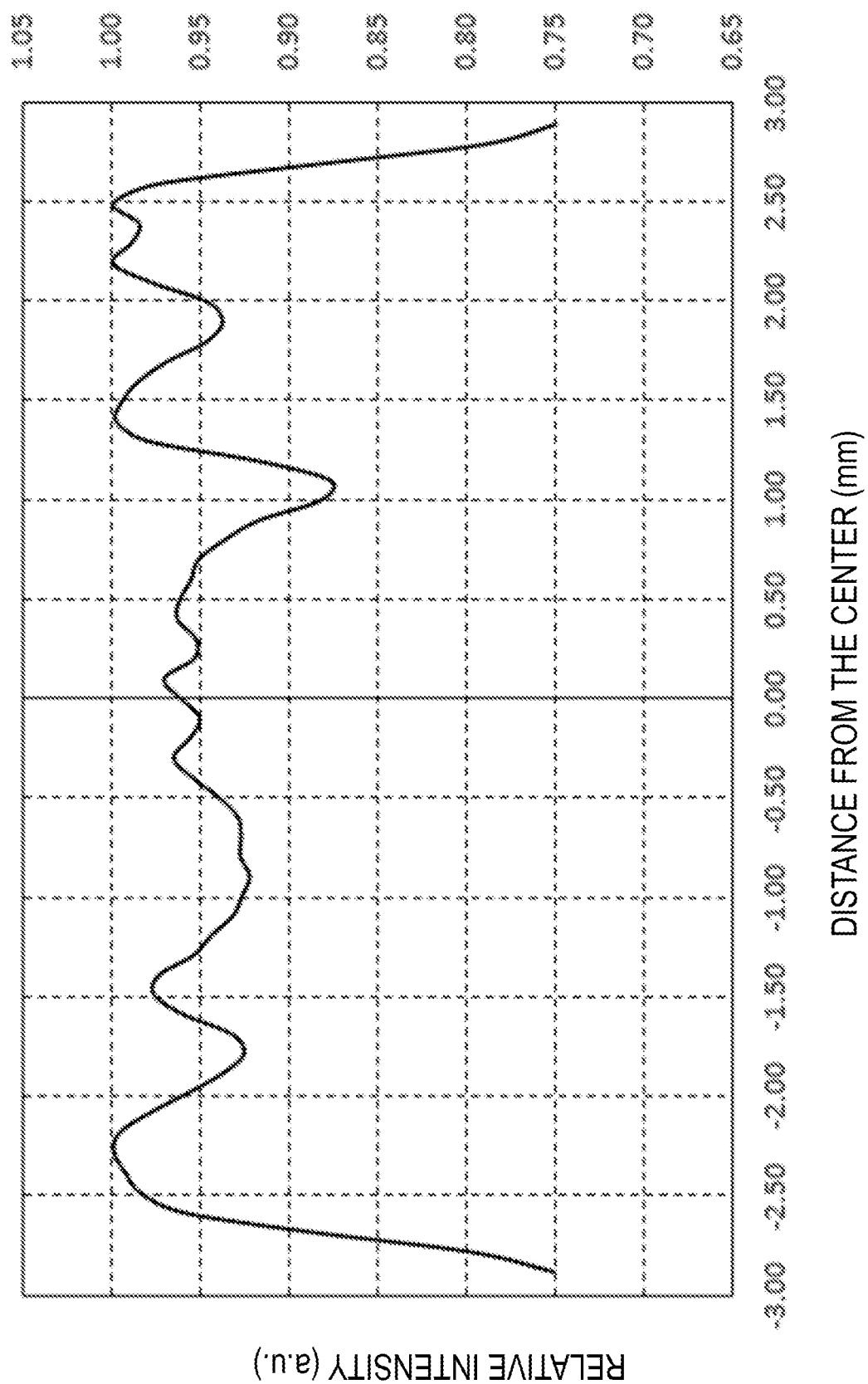
FIG. 19 schematically shows simulation results of a luminance profile on the assumption that the prism sheet is additionally disposed over the light-guiding plate of the sample of the example.
Figure 20:
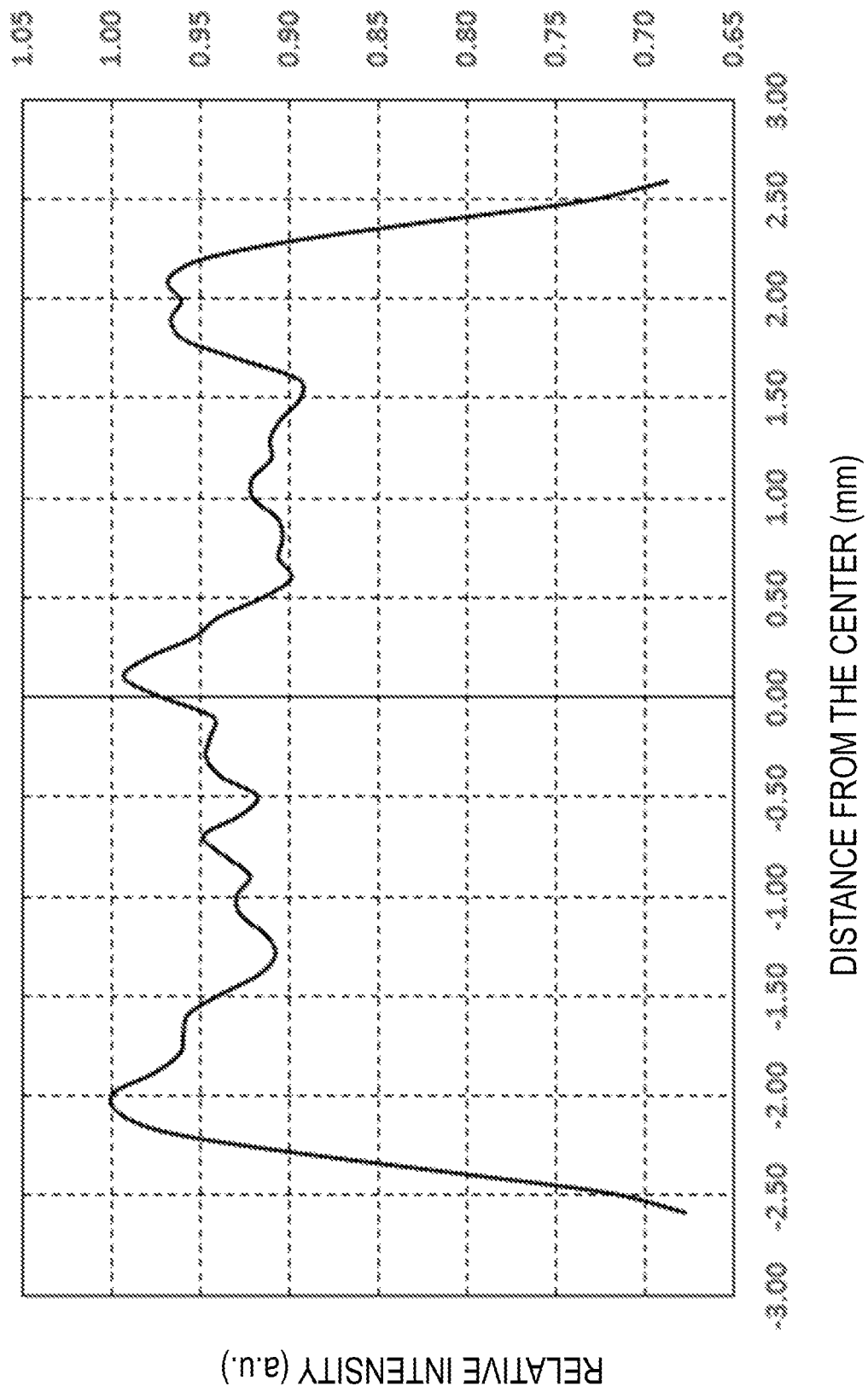
FIG. 20 schematically shows simulation results of a luminance profile on the assumption that the prism sheet is additionally disposed over a light-guiding plate of a sample of a reference example.

FIG. 18 and FIG. 19 schematically show simulation results of luminance profiles on the assumption that the prism sheet is additionally disposed over the light-guiding plate in the sample of the example. FIG. 18 schematically shows a luminance profile near the center of the light-guiding plate in the short direction of the light-guiding plate. FIG. 19 schematically shows a luminance profile near the center of the light-guiding plate in the longitudinal direction of the light-guiding plate. FIG. 20 schematically shows simulation results of a luminance profile on the assumption that a prism sheet is additionally disposed over the light-guiding plate of the sample of the reference example. FIG. 20 schematically shows a luminance profile near the center of the light-guiding plate in the short direction of the light-guiding plate. Calculation was performed on the assumption that the prism sheet was a layered body of a sheet including a plurality of triangular prismatic bodies each extending parallel to the short direction of the light-guiding plate on one main surface and a sheet including a plurality of triangular prismatic bodies each extending parallel to the longitudinal direction of the light-guiding plate on one main surface.

As comparison of the luminance on the prism sheet of the sample of the example with the luminance on the prism sheet of the sample of the reference example, the luminance of the sample of the example is greater than the luminance of the sample of the reference example. The luminances on the prism sheets were calculated as follows. The 16 light-emitting modules arranged in a four-by-four matrix were each divided into a plurality of regions using a mesh of an appropriate size, the luminance through the prism sheet in each region was determined, and the average value was regarded as the luminance on the prism sheet.

The uniformity of the luminance on the prism sheet was evaluated as follows. The two-by-two array located at the center of the 16 light-emitting modules arranged in a four-by-four matrix was extracted, and the extracted portion was divided into a plurality of regions using a mesh of an appropriate size. The luminance was calculated for each region. The maximum value and the minimum value were extracted from a plurality of luminance values obtained for each region, and a value calculated by the formula ((the minimum luminance value)/(the maximum luminance value))*100 (where "*" represents multiplication) was regarded as the "uniformity in luminance (%)" of the sample.

The uniformity in luminance of the sample of the reference example was 90%, and the uniformity in luminance of the sample of the example was 92%. That is, although uniformity about luminance is likely to become difficult to obtain as the light-guiding plate becomes thinner in general, but a higher luminance uniformity was obtained for the sample of the example despite the light-guiding plate thinner than the light-guiding plate of the sample of the reference example. It has been found that luminance non-uniformity on the upper surface of the light-guiding plate can be more effectively inhibited by employing an oval shape as the shape of the first opening of the first portion of the first hole.

The embodiments in the present disclosure are useful for various light sources for lighting, light sources for vehicles, light sources for displays, and the like. In particular, the embodiments can be advantageously applied to a backlight unit for a liquid-crystal display. The light-emitting modules or the surface-emitting light sources according to the embodiments in the present disclosure can be suitably used for a backlight for a display for a mobile device of which the thickness is highly required to be reduced, a surface-emitting device in which local dimming control is possible, or the like.

While certain embodiments of the present invention have been described with respect to exemplary embodiments thereof, it will be apparent to those skilled in the art that the disclosed invention can be modified in numerous ways and can assume many embodiments other than those specifically described above. Accordingly, it is intended by the appended claims to cover all modifications of the invention that fall within the true spirit and scope of the invention.

What is claimed is:

1. A light-emitting module comprising:
   a light-guiding plate having an upper surface with a first hole and a lower surface opposite to the upper surface, the light-guiding plate having a rectangular shape in a top view;
   a light-emitting element disposed at the lower surface of the light-guiding plate and opposite to the first hole; and
   a light-reflective layer,
   wherein the first hole comprises:
      a first portion; and
      a second portion between the first portion and the upper surface of the light-guiding plate,
   wherein the light-reflective layer is located in the first portion of the first hole,
   wherein the first portion is a depression having a first opening at a boundary between the first portion and the second portion and a first lateral surface inclined with respect to the upper surface of the light-guiding plate,
   wherein the second portion of the first hole has:
      a second opening at the upper surface of the light-guiding plate; and
      a second lateral surface between the second opening and the first opening of the first portion,
   wherein an inclination of the first lateral surface with respect to the upper surface of the light-guiding plate is gentler than an inclination of the second lateral surface with respect to the upper surface of the light-guiding plate, and
   wherein the first opening in the top view has an oval shape having a first axis parallel to a short side of the rectangular shape of the light-guiding plate and a second axis parallel to a long side of the rectangular shape and shorter than the first axis.

2. The light-emitting module according to claim 1, wherein the first portion of the first hole further has an inner wall surface between the first opening and the first lateral surface.

3. The light-emitting module according to claim 2, wherein the lower surface of the light-guiding plate has:
   a flat region; and
   an inclined region surrounding the flat region and rising from the flat region toward the upper surface of the light-guiding plate, and
   wherein a boundary between the flat region and the inclined region has an oval shape in the top view.

4. The light-emitting module according to claim 3, wherein the lower surface of the light-guiding plate is provided with a second hole opposite to the first hole, and wherein the light-emitting element is located inside the second hole in a bottom view.

5. The light-emitting module according to claim 4, further comprising a wavelength conversion member located inside the second hole and between the light-emitting element and the light-guiding plate.

6. The light-emitting module according to claim 2, further comprising a light-reflective member covering at least part of the lower surface of the light-guiding plate.

7. The light-emitting module according to claim 6, further comprising a wiring layer,
wherein the light-emitting element comprises an electrode at a position opposite to the light-guiding plate, and
wherein the wiring layer is located on a lower surface of the light-reflective member and electrically connected to the electrode.

8. The light-emitting module according to claim 1,
wherein the lower surface of the light-guiding plate has:
a flat region; and
an inclined region surrounding the flat region and rising from the flat region toward the upper surface of the light-guiding plate, and
wherein a boundary between the flat region and the inclined region has an oval shape in the top view.

9. The light-emitting module according to claim 1,
wherein the lower surface of the light-guiding plate is provided with a second hole opposite to the first hole, and
wherein the light-emitting element is located inside the second hole in a bottom view.

10. The light-emitting module according to claim 9, further comprising a wavelength conversion member located inside the second hole and between the light-emitting element and the light-guiding plate.

11. The light-emitting module according to claim 1, further comprising a light-reflective member covering at least part of the lower surface of the light-guiding plate.

12. The light-emitting module according to claim 11, further comprising a wiring layer,
wherein the light-emitting element comprises an electrode at a position opposite to the light-guiding plate, and
wherein the wiring layer is located on a lower surface of the light-reflective member and electrically connected to the electrode.

13. A surface-emitting light source comprising a plurality of light-emitting modules according to claim 1,
wherein the plurality of light-emitting modules are arranged in a plurality of rows and a plurality of columns.

14. The surface-emitting light source according to claim 13,
wherein the collective body of light-guiding plates of the plurality of light-emitting modules have a rectangular shape as a whole in the top view, and
wherein a ratio between a long side and a short side of the rectangular shape of the collective body of the light-guiding plates is equal to a ratio between the long side and the short side of the rectangular shape of the light-guiding plate of each of the plurality of light-emitting modules.

15. The surface-emitting light source according to claim 13,
wherein the first portion of the first hole further has an inner wall surface between the first opening and the first lateral surface.

16. The surface-emitting light source according to claim 15, further comprising a light-reflective member covering at least part of the lower surface of the light-guiding plate.

17. The surface-emitting light source according to claim 16, further comprising a wiring layer,
wherein the light-emitting element comprises an electrode at a position opposite to the light-guiding plate, and
wherein the wiring layer is located on a lower surface of the light-reflective member and electrically connected to the electrode,
wherein the lower surface of the light-guiding plate has:
a flat region; and
an inclined region surrounding the flat region and rising from the flat region toward the upper surface of the light-guiding plate, and
wherein a boundary between the flat region and the inclined region has an oval shape in the top view.

18. The surface-emitting light source according to claim 17,
wherein the lower surface of the light-guiding plate is provided with a second hole opposite to the first hole, and
wherein the light-emitting element is located inside the second hole in a bottom view.

19. The surface-emitting light source according to claim 13, further comprising a light-reflective member covering at least part of the lower surface of the light-guiding plate.

20. The surface-emitting light source according to claim 19, further comprising a wiring layer,
wherein the light-emitting element comprises an electrode at a position opposite to the light-guiding plate, and
wherein the wiring layer is located on a lower surface of the light-reflective member and electrically connected to the electrode.

* * * * *